(12) United States Patent
Takayanagi et al.

(10) Patent No.: US 8,525,355 B2
(45) Date of Patent: Sep. 3, 2013

(54) SEMICONDUCTOR DEVICE, ELECTRONIC APPARATUS AND SEMICONDUCTOR DEVICE FABRICATING METHOD

(75) Inventors: Hidenori Takayanagi, Nagano (JP); Yukiharu Takeuchi, Nagano (JP); Hiroki Toyazaki, Nagano (JP); Toshio Gomyo, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 873 days.

(21) Appl. No.: 11/736,926

(22) Filed: Apr. 18, 2007

(65) Prior Publication Data

US 2007/0246842 A1    Oct. 25, 2007

(30) Foreign Application Priority Data

Apr. 20, 2006    (JP) .................................. 2006-117074

(51) Int. Cl.
*H01L 23/29*    (2006.01)
(52) U.S. Cl.
USPC ............ 257/790; 257/787; 257/724; 257/686
(58) Field of Classification Search
USPC ................. 257/686, 777, 790, 788, E23.169, 257/723, 724, 787
See application file for complete search history.

(56) References Cited

U.S. PATENT DOCUMENTS

| | | | |
|---|---|---|---|
| 6,294,830 B1 * | 9/2001 | Fjelstad | 257/724 |
| 6,404,049 B1 * | 6/2002 | Shibamoto et al. | 257/712 |
| 6,605,875 B2 * | 8/2003 | Eskildsen | 257/777 |
| 6,673,441 B1 * | 1/2004 | Tanaka et al. | 428/355 EP |
| 6,753,613 B2 * | 6/2004 | Levardo et al. | 257/780 |
| 7,560,821 B2 * | 7/2009 | Osuga et al. | 257/788 |
| 2002/0011651 A1 | 1/2002 | Ichinose | |
| 2002/0125568 A1 * | 9/2002 | Jiang et al. | 257/737 |
| 2004/0097017 A1 | 5/2004 | Shimanuki | |
| 2005/0176171 A1 | 8/2005 | Miyaki et al. | |

FOREIGN PATENT DOCUMENTS

| | | |
|---|---|---|
| JP | 9-162348 | 6/1997 |
| JP | 2001-196526 | 7/2001 |
| JP | 2003-303919 | 10/2003 |
| JP | 2004-031946 | 1/2004 |
| JP | 2004-179622 | 6/2004 |
| JP | 2005-268533 | 9/2005 |
| WO | 2004/034433 | 4/2004 |
| WO | 2006/101199 | 9/2006 |

* cited by examiner

*Primary Examiner* — S. V. Clark
(74) *Attorney, Agent, or Firm* — Rankin, Hill & Clark LLP

(57) ABSTRACT

There is provided a semiconductor device which includes a primary semiconductor chip 11, a secondary semiconductor chip 12 stacked on the primary semiconductor chip 11, primary external connecting terminals 16 which are electrically connected with the primary semiconductor chip 11 via wires 21, secondary external connecting terminals 17 which are electrically connected with the secondary semiconductor chip 12 via wires 22 and primary and secondary low-elasticity resins 13, 15 which seal the primary and secondary semiconductor chips 11, 12 in such a manner as to cover them.

3 Claims, 21 Drawing Sheets

SEMICONDUCTOR DEVICE, ELECTRONIC APPARATUS AND SEMICONDUCTOR DEVICE FABRICATING METHOD

This application claims priority to Japanese Patent Application No. 2006-117074, filed Apr. 20, 2006, in the Japanese Patent Office. The priority application is incorporated by reference in its entirety.

TECHNICAL FIELD

The present disclosure relates to a semiconductor device, an electronic apparatus and a semiconductor device fabricating method, and more particularly to a semiconductor device including a semiconductor chip and a sealing resin which seals the semiconductor chip, an electronic apparatus and a semiconductor device fabricating method.

RELATED ART

FIG. 1 is a sectional view of a related-art semiconductor device.

Referring to FIG. 1, a related-art semiconductor device 200 has a semiconductor chip 201, a chip fixing resin 202, a sealing resin 203 and external connecting terminals 204.

The semiconductor chip 201 has a semiconductor substrate (not shown), semiconductor integrated circuits (not shown) formed on the semiconductor substrate and pads 206 which are electrically connected to the semiconductor integrated circuits. As the semiconductor substrate, for example, a silicon substrate can be used. The pads 206 are electrically connected with the external connecting terminals 204 via wires 209 (wire bonding connection), respectively.

The chip fixing resin 202 is provided in such a manner as to cover a rear surface 201A of the semiconductor chip 201. Used as the chip fixing resin 202 is a resin of high elasticity modulus which has adhesion property. To be specific, as the chip fixing resin 202, an acrylic resin or epoxy resin whose elasticity modulus is 5 GPa or more is used.

The sealing resin 203 is provided in such a manner as to cover the semiconductor chip 201 and the wires 209. The sealing resin 203 has protruding portions 208. A resin of high elasticity modulus is used as the sealing resin 203. To be specific, an epoxy resin whose elasticity modulus is 10 GPa or more is used as the sealing resin 203.

The external connecting terminal 204 has conduction property and is provided in such a manner as to cover the protruding portion 208. The external connecting terminal 204 is a terminal which is electrically connected with a wiring pattern provided on a printed circuit board (not shown) such as a motherboard.

FIGS. 2 to 8 are drawings which show fabricating steps of a related-art semiconductor device. In FIGS. 2 to 8, like reference numerals are given to like constituent portions to those of the related-art semiconductor device 200.

Referring to FIGS. 2 to 8, a fabricating method of a related-art semiconductor device 200 will be described. Firstly, in a step shown in FIG. 2, a photoresist coating 212 having openings 212A is formed on a metal plate 211. Following this, in a step shown in FIG. 3, recessed portions 211A are formed on the metal plate 211 through wet etching by the use of the photo resist coating 212 as a mask.

Next, in a step shown in FIG. 4, metal coatings are precipitated in the recessed portions 211A, respectively, through an electrolytic plating process in which the metal plate 211 is used as a feeding layer, so as to form external connecting terminals 204. Following this, in a step shown in FIG. 5, the photoresist coating 212 is removed.

Next, in a step shown in FIG. 6, a semiconductor chip 201 is affixed on to the metal plate 211 via a chip fixing resin 202 which has adhesion property. As this occurs, the chip fixing resin 202 is heated to set.

Next, in a step shown in FIG. 7, the external connecting terminals 204 and pads 206 are electrically connected via wires 209 (wire bonding connection), respectively. When the wires 209 are formed, a structure shown in FIG. 7 is heated. Following this, in a step shown in FIG. 8, a sealing resin 203 is formed in such a manner as to cover the semiconductor chip 201 and the wires 209. As this occurs, the sealing resin is 203 is heated to set. Thereafter, the metal plate 211 is removed, so that the semiconductor device 200 shown in FIG. 1 is fabricated (for example, refer to Japanese Patent Unexamined Publication No. 9-162348 (Patent Document No. 1)).

With the related-art semiconductor device 200, however, the sealing resin 203 having a different thermal expansion coefficient from that of the semiconductor chip 201 (to be specific, the semiconductor substrate (not shown)) is provided on an upper surface side of the semiconductor chip 201, and the chip fixing resin 202 having a different thermal expansion coefficient from that of the semiconductor chip 201 (to be specific, the semiconductor substrate (not shown)) is provided on a lower surface side of the semiconductor chip 201. Because of this, when the semiconductor device 200 is heated or the temperature of the semiconductor device 200 so heated is decreased, there has been caused a problem that a warp is generated in the semiconductor device 200. In the event that a warp is generated in the semiconductor device 200 in this way, the reliability in electric connection between the external connecting terminals 204 and the pads 206 is decreased.

In addition, with the fabricating method of the related-art semiconductor device, for example, in the steps shown in FIGS. 6 and 7, since the structure shown in FIGS. 6 and 7 is heated, there has been caused a problem that the structure shown in FIGS. 6 and 7 is warped due to a difference in thermal expansion coefficient between the metal plate 211 and the semiconductor chip 201. In addition, in the step shown in FIG. 8, since the structure shown in FIG. 8 is heated, there has been caused a problem that the structure shown in FIG. 8 is warped due to a difference in thermal expansion coefficient between the metal plate 211 and the sealing resin 203 and the semiconductor chip 201. Thus, in the event that the warp is generated in the ways described above during fabrication of the semiconductor device 200, the reliability in electric connection between the external connecting terminals 204 and the pads 206 is reduced, resulting in a reduction in the yield of semiconductor devices 200.

SUMMARY

Embodiments of the present invention provide a semiconductor device which can suppress the generation of a warp therein, an electronic apparatus which incorporates the semiconductor device and a fabricating method of the semiconductor device.

According to an aspect of the invention, there is provided a semiconductor device including a primary semiconductor chip, a secondary semiconductor chip stacked on the primary semiconductor chip, and a primary sealing resin which seals the primary and secondary semiconductor chips in such a manner as to cover them, wherein the primary sealing resin is a low-elasticity resin.

According to the invention, since stress that is to be generated between the low-elasticity resin and the primary and secondary semiconductor chips which have different thermal expansion coefficients is mitigated by providing the low-elasticity resin in such a manner as to cover the primary and secondary semiconductor chips, the generation of a warp in the semiconductor device can be suppressed.

According to another aspect of the invention, there is provided a semiconductor device fabricating method for fabricating a semiconductor device including a primary semiconductor chip, a secondary semiconductor chip stacked on the primary semiconductor, a primary external connecting terminal to which the primary semiconductor chip is electrically connected and a secondary external connecting terminal to which the secondary semiconductor chip is electrically connected, the method including an external connecting terminal forming step of forming a primary and secondary external terminal on a metal plate which constitutes a support plate, a primary semiconductor chip affixing step of affixing a primary semiconductor chip on to the metal plate via a primary low-elasticity resin, a secondary semiconductor chip affixing step of affixing a secondary semiconductor chip on to the primary semiconductor chip, and a sealing step of sealing the primary and secondary semiconductor chips with a secondary low-elasticity resin.

According to the invention, since stress that is to be generated between the primary semiconductor chip and the metal plate which have different thermal expansion coefficients is mitigated by the primary low-elasticity resin by affixing the primary semiconductor chip on to the metal plate via the primary low-elasticity resin, the generation of a warp can be suppressed.

In addition, the generation of a warp can further be suppressed by sealing the primary and secondary semiconductor chips by the secondary low-elasticity resin.

According to the invention, the generation of a warp can be suppressed not only during but also after fabrication of a semiconductor device.

Other features and advantages may be apparent from the following detailed description, the accompanying drawings and the claims.

DETAILED DESCRIPTION

Next, embodiments of the invention will be described based on the drawings.

First Embodiment

Figure 1:
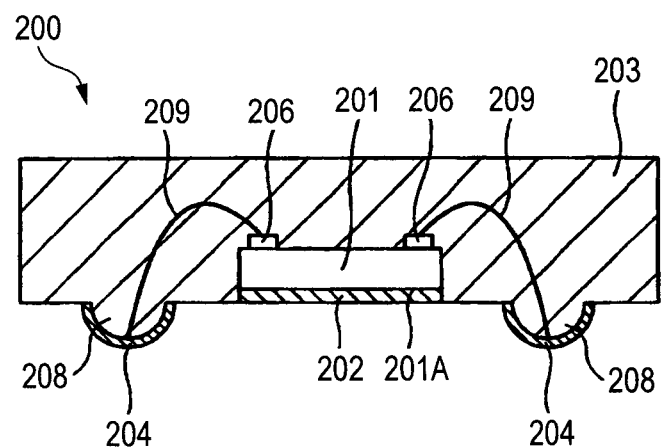
FIG. 1 is a sectional view of a related-art semiconductor device.
Figure 2:
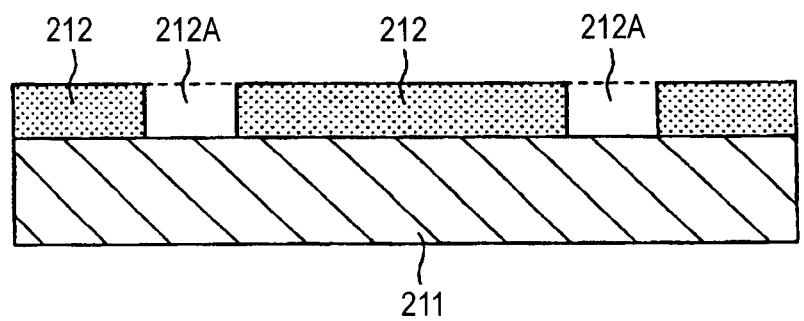
FIG. 2 is a (first) drawing showing a fabricating step of the related-art semiconductor device.
Figure 3:
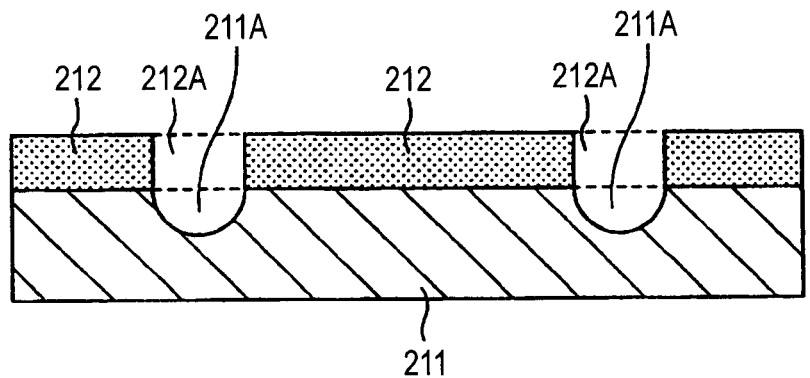
FIG. 3 is a (second) drawing showing a fabricating step of the related-art semiconductor device.
Figure 4:
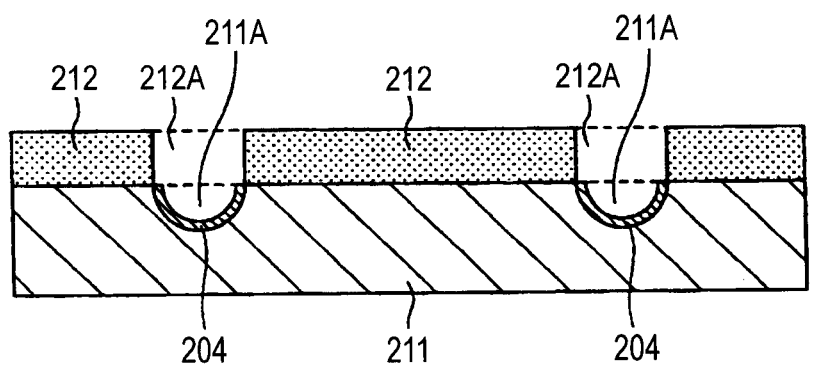
FIG. 4 is a (third) drawing showing a fabricating step of the related-art semiconductor device.
Figure 5:
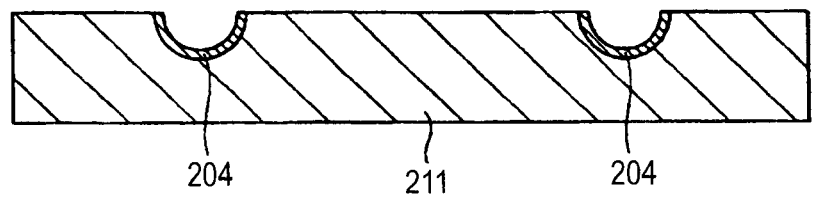
FIG. 5 is a (fourth) drawing showing a fabricating step of the related-art semiconductor device.
Figure 6:
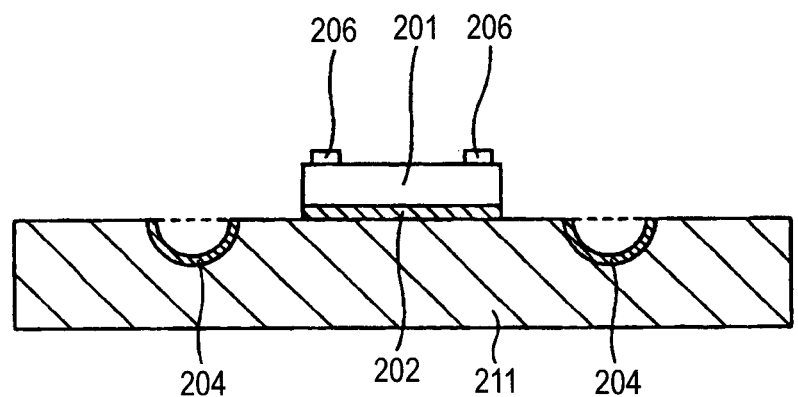
FIG. 6 is a (fifth) drawing showing a fabricating step of the related-art semiconductor device.
Figure 7:
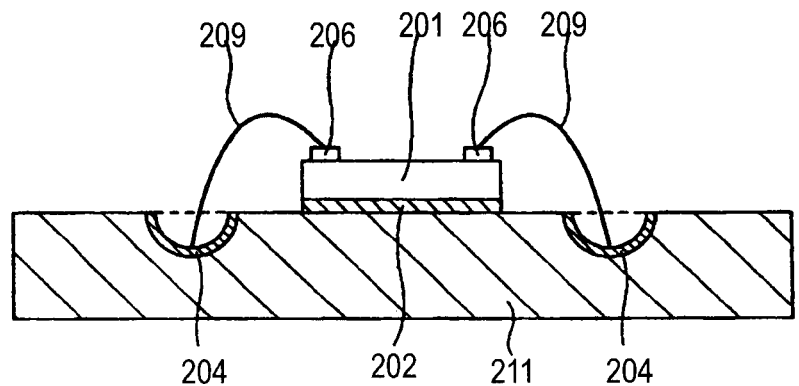
FIG. 7 is a (sixth) drawing showing a fabricating step of the related-art semiconductor device.
Figure 8:
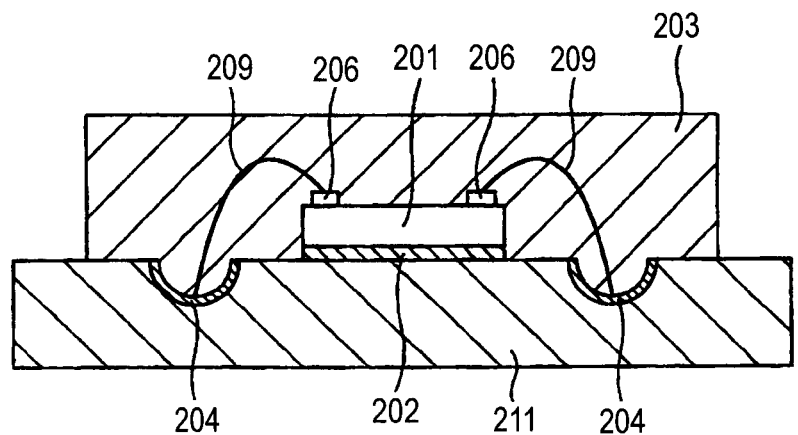
FIG. 8 is a (seventh) drawing showing a fabricating step of the related-art semiconductor device.
Figure 9:
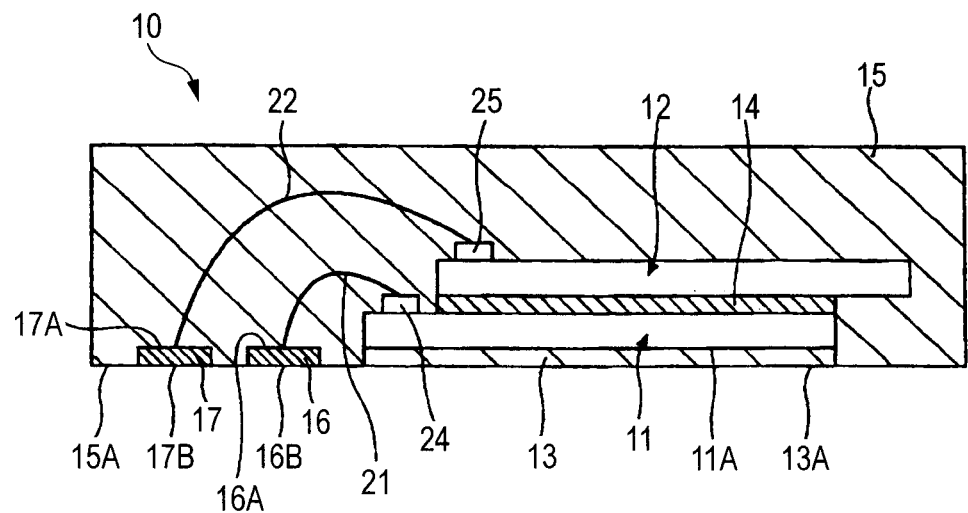
FIG. 9 is a sectional view of a semiconductor device according to a first embodiment of the invention.

FIG. 9 is a sectional view of a semiconductor device according to a first embodiment of the invention.

Referring to FIG. 9, a semiconductor device 10 of the first embodiment has a primary semiconductor chip 11, a secondary semiconductor chip 12, a primary low-elasticity resin 13, a secondary low-elasticity resin 15, primary external connecting terminals 16, secondary external connecting terminals 17 and wires 21, 22.

The primary semiconductor chip 11 has a semiconductor substrate (not shown), semiconductor integrated circuits (not shown) formed on the semiconductor substrate (not shown), and pads 24. As the semiconductor substrate, for example, a silicon substrate can be used. The pads 24 are electrically connected to the semiconductor integrated circuits (not shown). The pads 24 are electrically connected with the primary external connecting terminals 16 via the wires 21 (wire bonding connection).

The secondary semiconductor chip 12 is affixed on to the primary semiconductor chip 11 via a chip fixing resin 14 in such a manner as not to overlap the pads 24 provided on the primary semiconductor chip 11. Thus, by stacking the secondary semiconductor chip 12 on the primary semiconductor chip 11 in this way, the semiconductor device 10 can be miniaturized. As the chip fixing resin 14, for example, a die-attaching film can be used.

The secondary semiconductor chip 12 has a semiconductor substrate (not shown), semiconductor integrated circuits (not shown) formed on the semiconductor substrate (not shown), and pads 25. As the semiconductor substrate, for example, a silicon substrate can be used. The pads 25 are electrically connected with the secondary external connecting terminals 17 (wire bonding connection).

Figure 10:
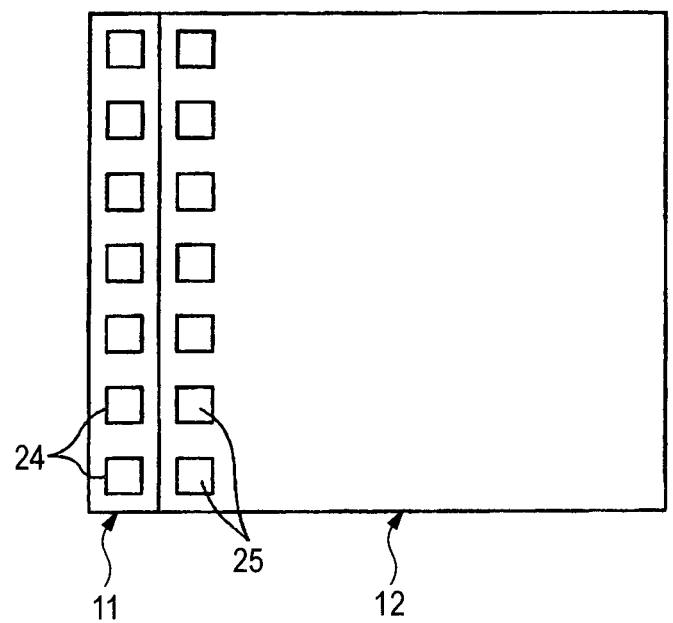
FIG. 10 is a (first) drawing showing a positional relationship between a primary semiconductor chip and a secondary semiconductor chip.
Figure 11:
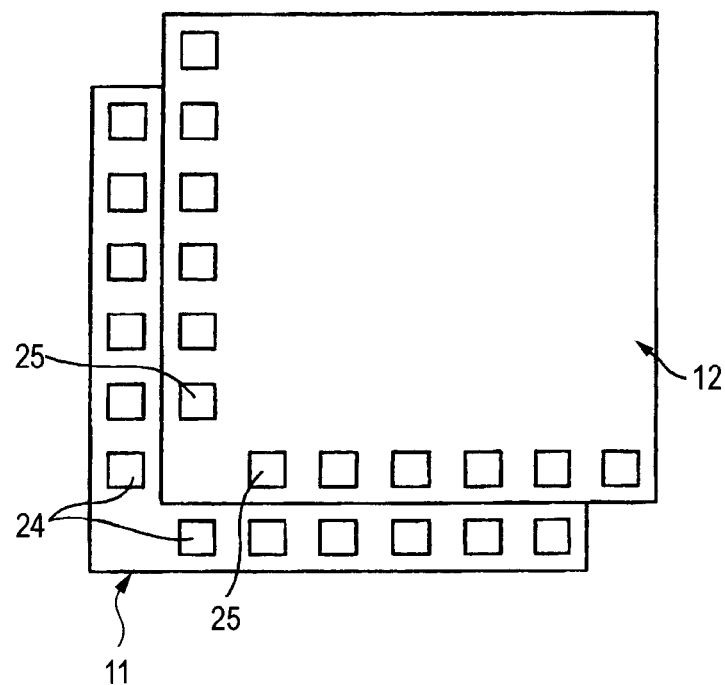
FIG. 11 is a (second) drawing showing a positional relationship between the primary semiconductor chip and the secondary semiconductor chip.

FIGS. 10 and 11 are drawings which explain positional relationships between the primary semiconductor chip and the secondary semiconductor chip.

For example, when the pads 24 are provided only along a side of the semiconductor chip 11, the secondary semiconductor chip 12 can be disposed as shown in FIG. 10 relative to the primary semiconductor chip 11. In addition, when the pads 24 are provided along two sides of the primary semiconductor chip 11, the secondary semiconductor chip 12 can be disposed as shown in FIG. 11 relative to the primary semiconductor chip 11.

Referring to FIG. 9, the primary low-elasticity resin 13 is provided in such a manner as to cover a lower surface 11A of the primary semiconductor chip 11. Thus, the primary low-elasticity resin 13 seals part of the primary semiconductor chip 11 (in this case, the lower surface 11A side of the semiconductor chip 11). A lower surface 13A of the primary low-elasticity resin 13 is made to be substantially level with a lower surface 15A of the secondary low-elasticity resin 15.

The primary low-elasticity resin 13 is a resin of low elasticity modulus and has a function to mitigate stress. In addition, the primary low-elasticity resin 13 has a function as an adhesive. As the primary low-elasticity resin 13, for example, a resin whose elasticity modulus is in the range of 1 MPa to 1 GPa can be used. In the event that a resin whose elasticity modulus is smaller than 1 MPa is used, the resin is so soft to produce difficulty in proper handling thereof at the time of fabricating the semiconductor device 10. On the contrary, in the event that a resin whose elasticity modulus is larger than 1 GPa is used, the effect of suppressing the generation of a warp in the semiconductor device 10 is reduced. To be specific, as the primary low-elasticity resin 13, for example, an elastomer can be used. In addition, the thickness of the primary low-elasticity resin 13 can be made to be, for example, 0.025 mm.

Together with the primary low-elasticity resin 13, the secondary low-elasticity resin 15 seals the primary and secondary semiconductor chips 11, 12 and the wires 21, 22, whereby the primary and secondary semiconductor chips are covered by the primary and secondary low-elasticity resins 13, 15. The lower surface 15A of the secondary low-elasticity resin 15 is made to be substantially level with the lower surface 13A of the primary low-elasticity resin 13. The secondary low-elasticity resin 15 is a resin of low elasticity modulus and has a function to mitigate stress.

As the secondary low-elasticity resin 15, for example, a resin whose elasticity modulus is in the range of 1 MPa to 1 GPa can be used. In the event that a resin whose elasticity modulus is smaller than 1 MPa is used, the resin is so soft to produce difficulty in proper handling thereof at the time of fabricating the semiconductor device 10. On the contrary, in the event that a resin whose elasticity modulus is larger than 1 GPa is used, the effect of suppressing the generation of a warp in the semiconductor device 10 is reduced. To be specific, as the secondary low-elasticity resin 15, for example, an elastomer can be used.

Thus, since stress that is generated between the primary and secondary low-elasticity resins 13, 15 and the primary and secondary semiconductor chips 11, 12 (to be specific, semiconductor substrates (not shown) provided in the primary and secondary semiconductor chips 1, 12) which have different thermal expansion coefficients is mitigated by covering the primary and secondary semiconductor chips 11, 12 which are stacked one on the other by the primary and secondary low-elasticity resins 13, 15, the generation of a warp in the semiconductor device 10 can be suppressed, whereby the reliability in connection between the primary external connecting terminals 16 and the pads 24 and the reliability in connection between the secondary external connecting terminals 17 and the secondary pads 25 can be secured sufficiently.

The primary external connecting terminals 16 are provided on the lower surface 15A side of the secondary low-elasticity resin 15. An upper surface 16A of the primary external connecting terminal 16 is connected with the wire 21, whereby the primary external connecting terminal 16 is electrically connected with the primary semiconductor chip 11. A lower surface 16B of the primary external connecting terminal 16 is exposed from the secondary low-elasticity resin 15. When the semiconductor device 10 is mounted on a printed circuit board (not shown), the lower surfaces 16B of the primary external connecting terminals 16 are electrically connected with a wiring pattern (not shown) on the printed circuit board (refer to FIG. 32).

The secondary external connecting terminals 17 are provided on the lower surface 15A side of the secondary low-elasticity resin 15. An upper surface 17A of the secondary external connecting terminal 17 is connected with the wire 22, whereby the secondary external connecting terminal 17 is electrically connected with the secondary semiconductor chip 12. A lower surface 17B of the secondary external connecting terminal 17 is exposed from the secondary low-elasticity resin 15. When the semiconductor device 10 is mounted on the printed circuit board (not shown), the lower surfaces 17B of the secondary external connecting terminals 17 are electrically connected with a wiring pattern (not shown) on the printed circuit board (refer to FIG. 32).

The wires 21 are sealed in by the secondary low-elasticity resin 15. One end portion of the wire 21 is connected to the pad 24, while the other end portion of the wire 21 is connected to the primary external connecting terminal 16.

The wires 22 are sealed in by the secondary low-elasticity resin 15. One end portion of the wire 22 is connected to the pad 25, while the other end portion of the wire 22 is connected to the secondary external connecting terminal 17.

According to the semiconductor device of this embodiment, since stress that is generated between the primary and secondary low-elasticity resins 13, 15 and the primary and secondary semiconductor chips 11, 12 (to be specific, semiconductor substrates (not shown) provided in the primary and secondary semiconductor chips 1, 12) which have different thermal expansion coefficients is mitigated by covering the primary and secondary semiconductor chips 11, 12 which are stacked one on the other by the primary and secondary low-elasticity resins 13, 15, the generation of a warp in the semiconductor device 10 can be suppressed, whereby the reliability in connection between the primary external connecting terminals 16 and the pads 24 and the reliability in connection between the secondary external connecting terminals 17 and the secondary pads 25 can be secured sufficiently.

In addition, in the semiconductor device of the embodiment, while the case is described in which the die-attaching film is used as the chip fixing resin 14, the primary low-elasticity resin 13 which has been described before may be used as the chip fixing resin 14.

Figure 12:
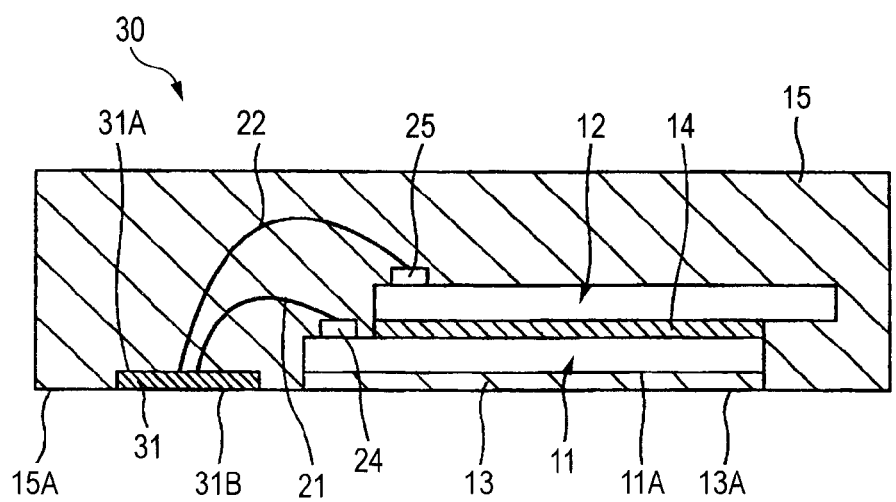
FIG. 12 is a sectional view of a semiconductor device according to a first modified example of the first embodiment of the invention.

FIG. 12 is a sectional view of a semiconductor device according to a first modified example of the first embodiment of the invention. In FIG. 12, like reference numerals will be given to like constituent portions to the semiconductor device 10 of the first embodiment.

Referring to FIG. 12, a semiconductor device 30 according to the first modified example of the first embodiment is configured similarly to the semiconductor device 10 except that external connecting terminals 31 are provided in place of the primary and secondary connecting terminals 16, 17.

The external connecting terminals 31 are provided on a lower surface 15A side of a secondary low-elasticity resin 15. Upper surfaces 31A of the external connecting terminals 31 are connected with wires 21, 22, whereby the external connecting terminals 31 are electrically connected with a primary and secondary semiconductor chip 11, 12. Lower surfaces 31B of the external connecting terminals 31 are exposed from the secondary low-elasticity resin 15. When the semiconductor device 30 is mounted on a printed circuit board (not shown), the external connecting terminals 31 are electrically connected with a wiring pattern (not shown) on the printed circuit board.

Also with the semiconductor device 30 according to the first modified example of the first embodiment that is configured in the way described above, an advantage can be obtained which is similar to that obtained with the semiconductor device 10 of the first embodiment.

Figure 13:
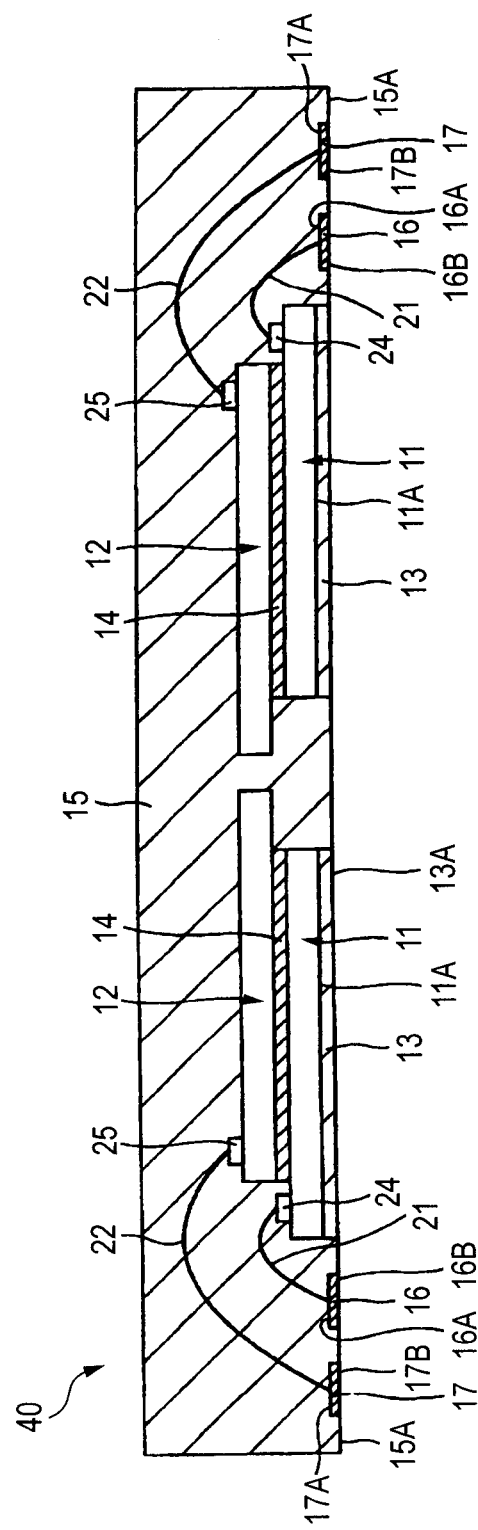
FIG. 13 is a sectional view of a semiconductor device according to a second modified example of the first embodiment of the invention.

FIG. 13 is a sectional view of a semiconductor device according to a second modified example of the first embodiment of the invention. In FIG. 13, like reference numerals will be given to like constituent portions to the semiconductor device 10 of the first embodiment.

Referring to FIG. 13, a semiconductor device 40 according to the second modified example of the first embodiment is configured similarly to the semiconductor device 10 except that a primary semiconductor chip 11, a secondary semiconductor chip 12, a primary low-elasticity resin 13, primary external connecting terminals 16, secondary connecting terminals 17 and wires 21, 22 are provided further thereon in addition to the configuration of the semiconductor device 10 of the first embodiment. The semiconductor device 40 is configured so as to have provided thereon two sets of stacked primary and secondary semiconductor chips 11, 12.

Also with the semiconductor device 40 according to the second modified example of the first embodiment that is configured as described above, an advantage can be obtained which is similar to that obtained with the semiconductor device 10 of the first embodiment.

FIGS. 14 to 21 are drawings which show fabricating steps of the semiconductor device according to the first embodiment of the invention. In FIGS. 14 to 21, like reference numerals will be given to like constituent portions to those of the semiconductor device 10 of the first embodiment.

Referring to FIGS. 14 to 21, a fabricating method of the semiconductor device 10 of the first embodiment of the invention will be described.

Figure 14:
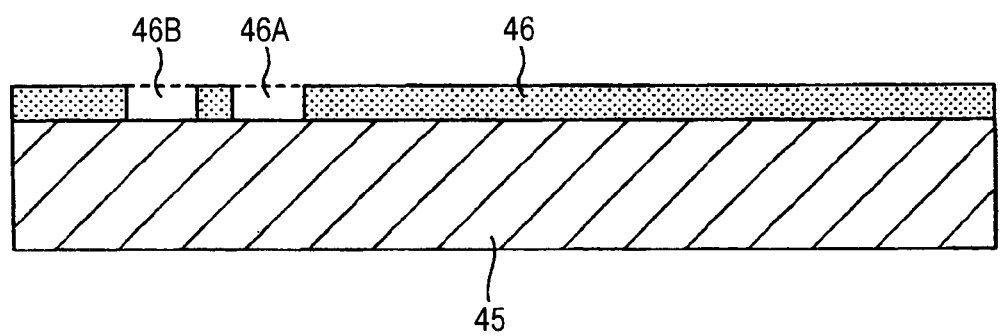
FIG. 14 is a (first) drawing showing a fabricating step of the semiconductor device according to the first embodiment of the invention.

Firstly, in a step shown in FIG. 14, a photoresist coating 46 having openings 46A, 46B is formed on a metal plate 45 which constitutes a support plate. As a material of the metal plate 45, for example, Cu, 42 alloy and the like can be used. The openings 46A lie to correspond to positions where primary external connecting terminals 16 are to be formed, and the openings 46B lie to correspond to positions where secondary external connecting terminals 17 are to be formed.

Figure 15:
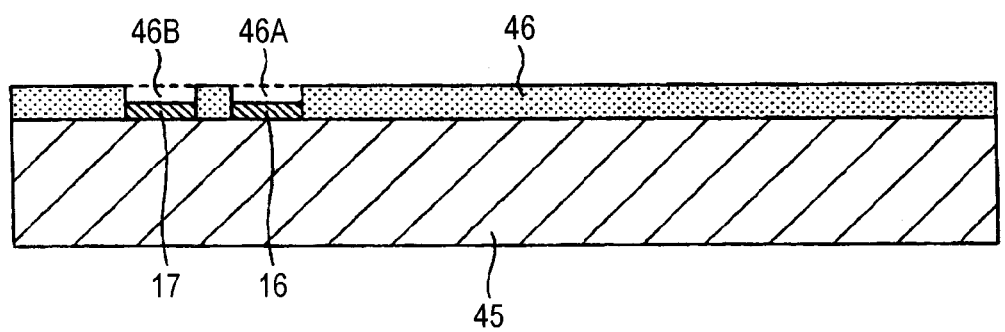
FIG. 15 is a (second) drawing showing a fabricating step of the semiconductor device according to the first embodiment of the invention.

Next, in a step shown in FIG. 15, conductive metal is precipitated on the metal plate 45 which is exposed through the openings 46A, 46B by an electrolytic plating process in which the metal plate 45 is used as a feeding layer, so as to form primary and secondary connecting terminals 16, 17 simultaneously (an external connecting terminal forming step).

Specifically speaking, for example, an Au layer, an Ni layer and an Au layer are precipitated sequentially on the metal plate 45 exposed through the openings 46A, 46B by the electrolytic plating process, so as to simultaneously form primary and secondary connecting terminals 16, 17 which are each made up of the Au layer/Ni layer/Au layer.

Figure 16:
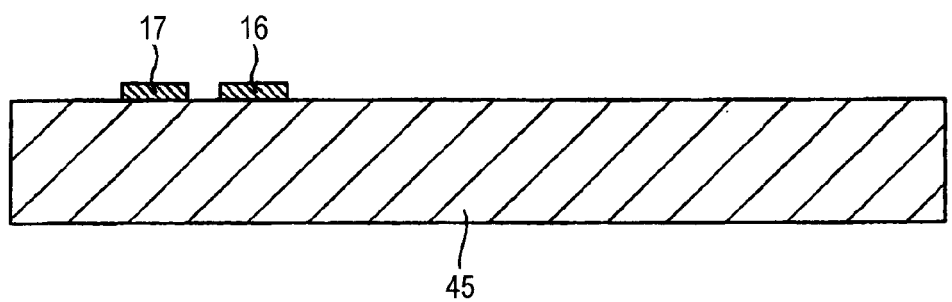
FIG. 16 is a (third) drawing showing a fabricating step of the semiconductor device according to the first embodiment of the invention.

Following this, in a step shown in FIG. 16, the photoresist coating 46 is removed. Following this, in a step shown in FIG. 17, a primary semiconductor chip 11 is affixed on to the metal plate 45 via a primary low-elasticity resin 13 (a primary semiconductor chip affixing step).

The primary low-elasticity resin 13 is a resin of low elasticity modulus and has a function to mitigate stress. As the primary low-elasticity resin 13, for example, a resin whose elasticity modulus is in the range of 1 MPa to 1 GPa can be used. In the event that a resin whose elasticity modulus is smaller than 1 MPa is used, the resin is so soft to produce difficulty in proper handling thereof at the time of fabricating the semiconductor device 10. On the contrary, in the event that a resin whose elasticity modulus is larger than 1 GPa is used, the effect of suppressing the generation of a warp in the semiconductor device 10 is reduced. To be specific, as the primary low-elasticity resin 13, for example, an elastomer can be used.

By affixing the primary semiconductor chip 11 on to the metal plate 45 via the primary low-elasticity resin 13 having the function to mitigate stress in this way, the primary low-elasticity resin 13 is provided between the primary semiconductor chip 11 and the metal plate 45 which have different thermal expansion coefficients, whereby since, in the event that stress is generated between the metal plate 45 and the primary semiconductor chip 11, the stress so generated is mitigated by the primary low-elasticity resin 13, the generation of a warp during fabrication of the semiconductor device 10 can be suppressed.

Figure 18:
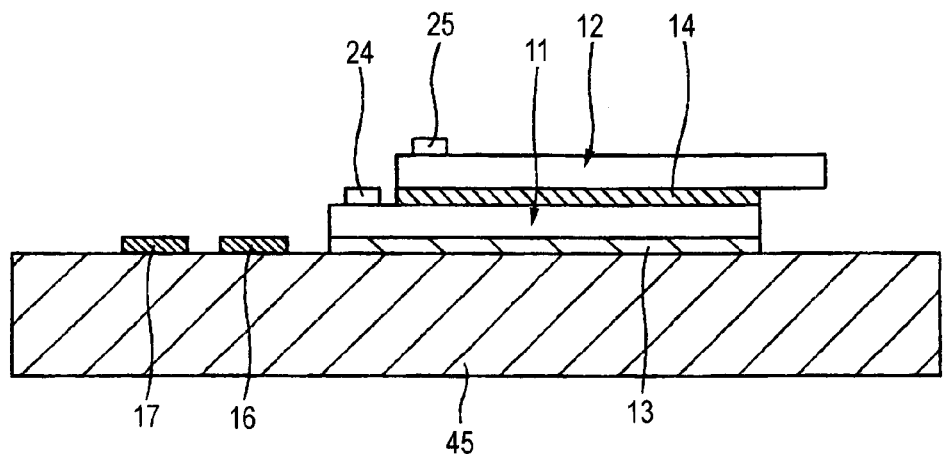
FIG. 18 is a (fifth) drawing showing a fabricating step of the semiconductor device according to the first embodiment of the invention.

Next, in a step shown in FIG. 18, a secondary semiconductor chip 12 is affixed on to the primary semiconductor chip 11 via a chip fixing resin 14 (a secondary semiconductor chip affixing step). As this occurs, the secondary semiconductor chip 12 is affixed on to the primary semiconductor chip 11 in such a manner as not to overlap pads 24 which are provided on the primary semiconductor chip 11. Thus, by affixing the secondary semiconductor chip 12 on to the primary semiconductor chip 11 in such a manner as not to overlap the pads 24, the primary semiconductor chip 11 and the primary external connecting terminals 16 can be connected to each other via wires 21. As the chip fixing resin 14, a die-attaching film can be used.

Figure 19:
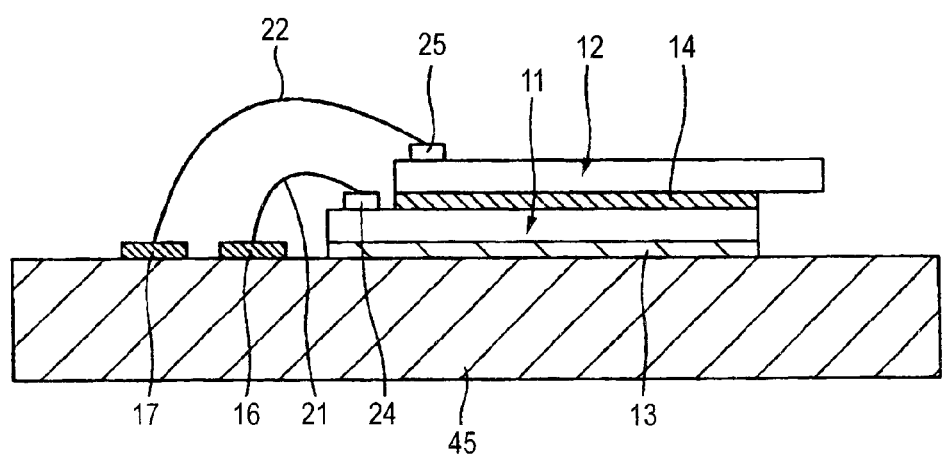
FIG. 19 is a (sixth) drawing showing a fabricating step of the semiconductor device according to the first embodiment of the invention.

Next, in a step shown in FIG. 19, the pads 24 on the primary semiconductor chip 11 and the primary external connecting terminals 16 are electrically connected to each other via the wires 21, and pads 25 on the secondary semiconductor chip 12 and the secondary external connecting terminals 17 are electrically connected to each other via wires 22, whereby the primary semiconductor chip 11 is wire bonding connected relative to the primary external connecting terminals 16, while the secondary semiconductor chip 12 is wire bonding connected relative to the secondary external connecting terminals 17.

Figure 20:
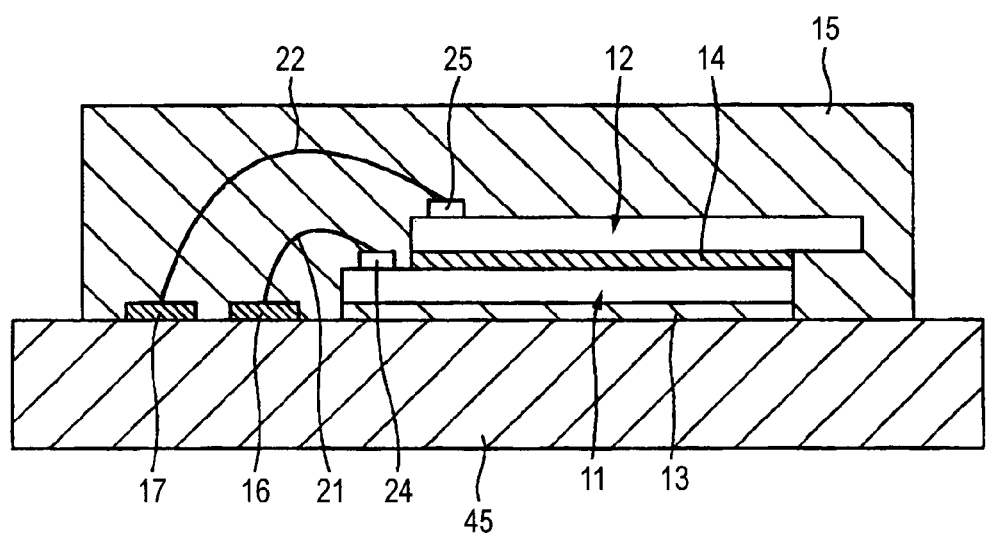
FIG. 20 is a (seventh) drawing showing a fabricating step of the semiconductor device according to the first embodiment of the invention.

Following this, in a step shown in FIG. 20, a secondary low-elasticity resin 15 is formed in such a manner as to cover the primary and secondary semiconductor chips 11, 12, the wires 21, 22, and the primary and secondary external connecting terminals 16, 17 (a sealing step), whereby the primary and secondary semiconductor chips 11, 12 and the wires 21, 22 are sealed in by the primary and secondary low-elasticity resins 13, 15.

As the secondary low-elasticity resin 15, for example, a resin whose elasticity modulus is in the range of 1 MPa to 1 GPa can be used. In the event that a resin whose elasticity modulus is smaller than 1 MPa is used, the resin is so soft to produce difficulty in proper handling thereof at the time of fabricating the semiconductor device 10. On the contrary, in the event that a resin whose elasticity modulus is larger than 1 GPa is used, the effect of suppressing the generation of a warp in the semiconductor device 10 is reduced. To be specific, as the secondary low-elasticity resin 15, for example, an elastomer can be used.

Thus, since, in the event that stress is generated in the structure shown in FIG. 20, the stress so generated is mitigated by the primary and secondary low-elasticity resins 13, 15 which have the functions to mitigate stress by sealing the primary and secondary semiconductor chips 11, 12 and the wires 21, 22 by the primary and secondary low-elasticity resins 13, 15 in the way described above, the generation of a warp during fabrication of the semiconductor chip 10 can be suppressed, whereby the reliability in electric connection between the primary semiconductor chip 11 and the primary external connecting terminals 16 and the reliability in electric connection between the secondary semiconductor chip 12 and the secondary external connecting terminals 17 can be increased.

Figure 21:
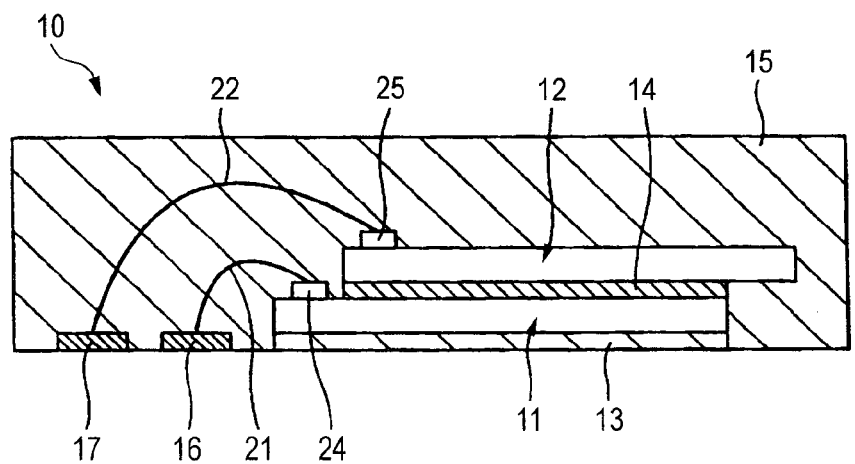
FIG. 21 is an (eighth) drawing showing a fabricating step of the semiconductor device according to the first embodiment of the invention.

Next, in a step shown in FIG. 21, the metal plate 45 is removed by etching, whereby the semiconductor device 10 is fabricated.

According to the semiconductor fabricating method of this embodiment, in the event that stress is generated between the primary semiconductor chip 11 and the metal plate 45 which have the different thermal expansion coefficients, the stress so generated is mitigated by the primary low-elasticity resin 13 by affixing the primary semiconductor chip 11 on to the metal plate 45 via the primary low-elasticity resin 13 which has the function to mitigate stress, thereby making it possible to suppress the generation of a warp.

In addition, by sealing the primary and secondary semiconductor chips 11, 12 and the wires 21, 22 by the primary and secondary low-elasticity resins 13, 15 which have the functions to mitigate stress, in the event that stress is generated in the structure shown in FIG. 20, the stress so generated is mitigated by the primary and secondary low-elasticity resins 13, 15, thereby making it possible to suppress the generation of a warp.

Note that while the embodiment has been described heretofore by taking as an example the case in which the single semiconductor device 10 is fabricated on the metal plate 45, a plurality of semiconductor devices 10 may be formed integrally on the metal plate 45, then the plurality of semiconductor devices 10 so formed are divided into individual pieces, and thereafter, the metal plate 45 is removed, so as to fabricate the plurality of semiconductor devices 10.

Second Embodiment

Figure 22:
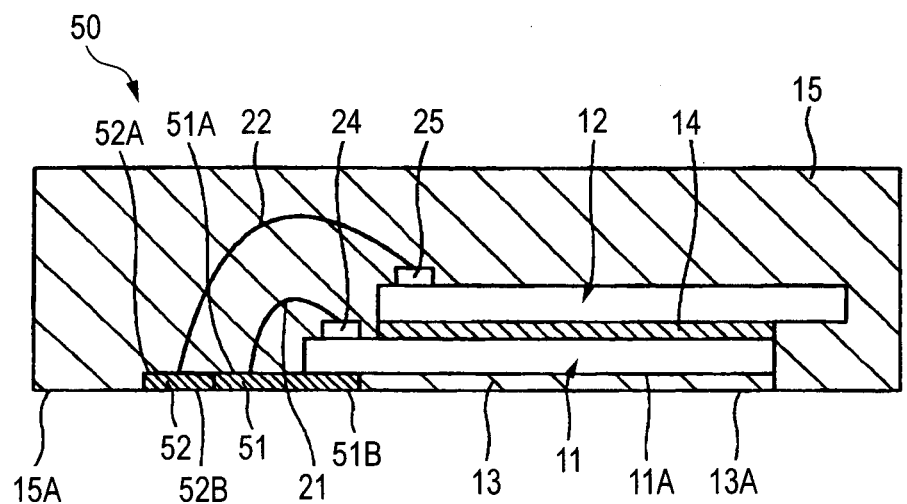
FIG. 22 is a sectional view of a semiconductor device according to a second embodiment of the invention.

FIG. 22 is a sectional view of a semiconductor device according to a second embodiment of the invention. In FIG. 22, like reference numerals will be given to like constituent portions to those of the semiconductor device 10 of the first embodiment.

Referring to FIG. 22, a semiconductor device 50 of the second embodiment is configured similarly to the semiconductor device 10 of the first embodiment except that primary and secondary external connecting terminals 51, 52 are provided in place of the primary and secondary external connecting terminals 16, 17 which are provided on the semiconductor device 10 of the first embodiment.

Figure 23:
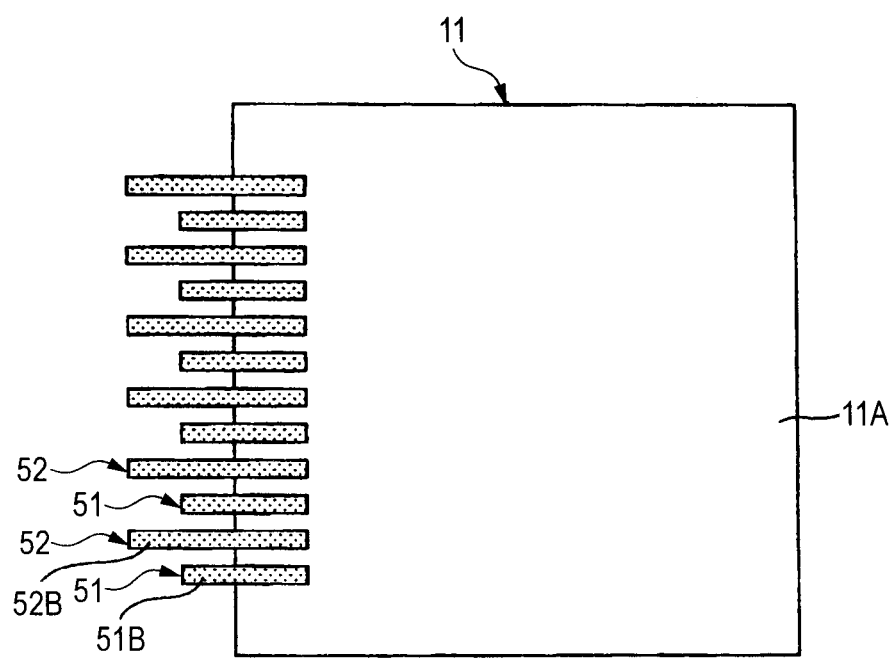
FIG. 23 is a drawing showing a positional relationship between primary and secondary external connecting terminals and a primary semiconductor chip.

FIG. 23 is a drawing which explains a positional relationship between primary and secondary external connecting terminals and a primary semiconductor chip.

Referring to FIGS. 22 and 23, primary and secondary external connecting terminals 51, 52 will be described. The primary and secondary external connecting terminals 51, 52 are disposed alternately. The primary and secondary external connecting terminals 51, 52 are sealed in by a secondary low-elasticity resin 15. Lower surfaces 51B, 52B of the primary and secondary external connecting terminals 51, 52 are exposed from the secondary low-elasticity resin 15. The lower surfaces 51B, 52B of the primary and secondary external connecting terminals 51, 52 are made to be substantially level with a lower surface 15A of the secondary low-elasticity resin 15.

Figure 33:
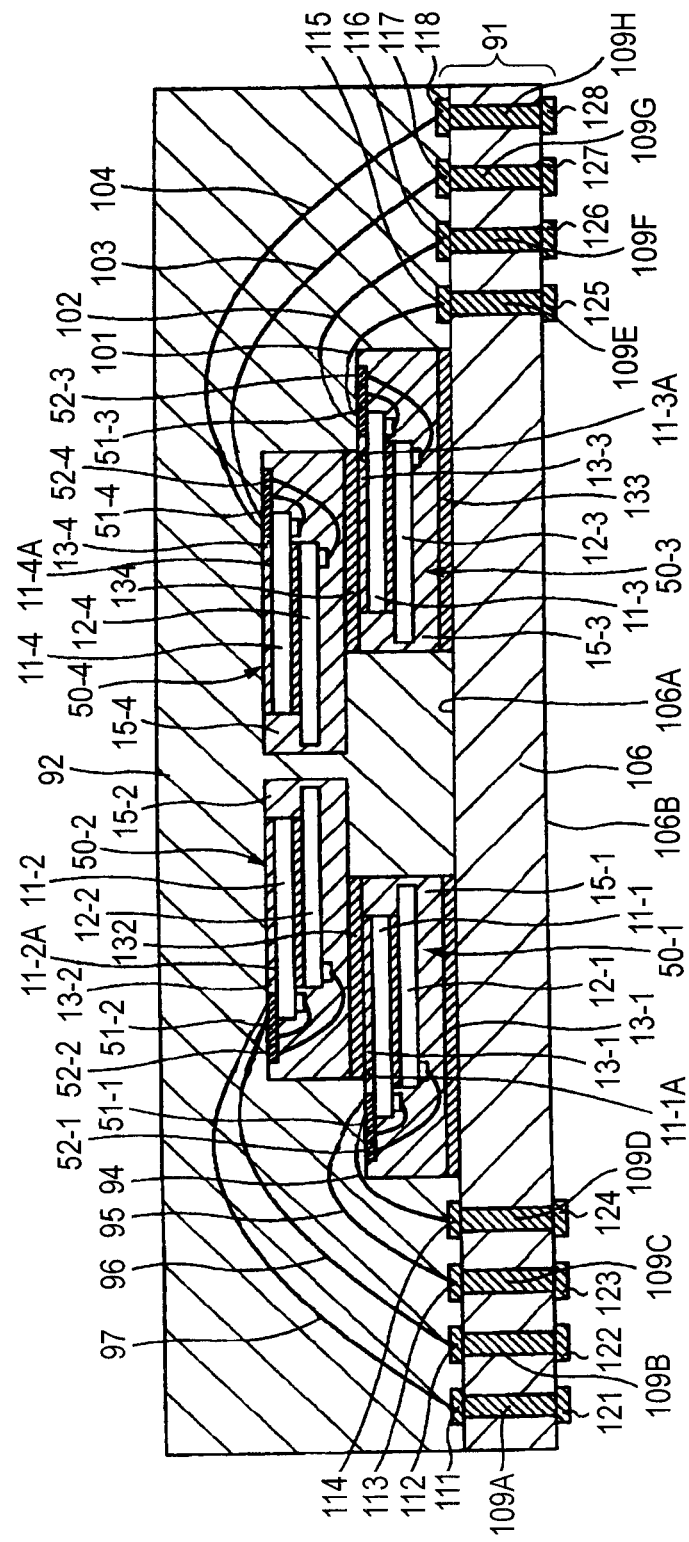
FIG. 33 is a sectional view of an electronic apparatus according to a fifth embodiment.

The primary external connecting terminals 51 are made to partially contact a lower surface 11A of a primary semiconductor chip 11. When an electronic apparatus is manufactured (or the semiconductor device is mounted on a printed circuit board) as shown in FIG. 33, the primary semiconductor chip 11 functions as a support plate for the primary external connecting terminals 51 by making the primary external connecting terminals 51 partially contact the lower surface 11A of the primary semiconductor chip 11 in this way. Therefore, the amount of displacement of portions of the primary external connecting terminals 51 which contact the lower surface 11A of the primary semiconductor chip 11, which occurs when one end of wire, the other end of which is connected to the printed circuit board, is connected to the primary external connecting terminals 51, can be made small.

Upper surfaces 51A of the primary external connecting terminals 51 are electrically connected to the primary semiconductor chip 11 via wires 21. When the semiconductor device 50 is mounted on a printed circuit board (not shown), wires which are made to connect with a wiring pattern (not shown) on the printed circuit board are connected with the portions of the primary external connecting terminals 51 which contact the lower surface 11A of the primary semiconductor chip 11 (refer to FIG. 33).

The secondary external connecting terminals 52 are made to partially contact the lower surface 11A of the primary semiconductor chip 11. When an electronic apparatus is manufactured (or the semiconductor device is mounted on a printed circuit board) as shown in FIG. 33, the primary semiconductor chip 11 functions as a support plate for the secondary external connecting terminals 52 by making the secondary external connecting terminals 52 partially contact the lower surface 11A of the primary semiconductor chip 11 in this way. Therefore, the amount of displacement of portions of the secondary external connecting terminals 52 which contact the lower surface 11A of the primary semiconductor chip 11, which occurs when one end of wire, the other end of which is connected to the printed circuit board, is connected to the secondary external connecting terminals 52, can be made small.

Upper surfaces 52A of the secondary external connecting terminals 52 are electrically connected to a secondary semiconductor chip 12 via wires 22. When the semiconductor device 50 is mounted on the printed circuit board (not shown), wires which are made to connect with a wiring pattern (not shown) on the printed circuit board are connected with the portions of the secondary external connecting terminals 52 which contact the lower surface 11A of the primary semiconductor chip 11 (refer to FIG. 33).

According to the semiconductor device of this embodiment, by disposing the primary and secondary external connecting terminals 51, 52 in such a manner that the portions of the primary and secondary external connecting terminals 51, 52 contact the lower surface 11A of the primary semiconductor chip 11, when the semiconductor device 50 is mounted on the printed circuit board (not shown), the wires (not shown) which are made to connect with the printed circuit board can be connected to the portions of the primary and secondary external connecting terminals 51, 52 which contact the lower surface 11A of the primary semiconductor chip 11 (that is, the portions of the primary and secondary external connecting terminals 51, 52 of which the amount of displacement is made small), whereby the reliability in connection between the primary and secondary external connecting terminals 51, 52 and the wires (not shown) which are made to connect with the printed circuit board can be increased.

Figure 17:
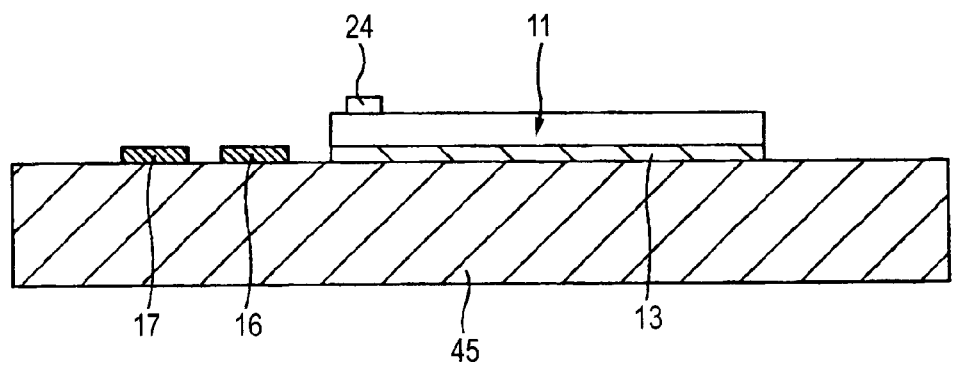
FIG. 17 is a (fourth) drawing showing a fabricating step of the semiconductor device according to the first embodiment of the invention.

In the step shown in FIG. 17 which has been described before with respect to the first embodiment, the semiconductor device 50 of the second embodiment can be fabricated in the same method as that by which the semiconductor device 10 of the first embodiment is fabricated except that the primary semiconductor chip 11 is affixed on to a metal plate 45 in such a manner that the lower surface 11A of the primary semiconductor chip 11 is brought into partial contact with the upper surfaces 51A, 52A of the primary and secondary external connecting terminals 51, 52.

Figure 24:
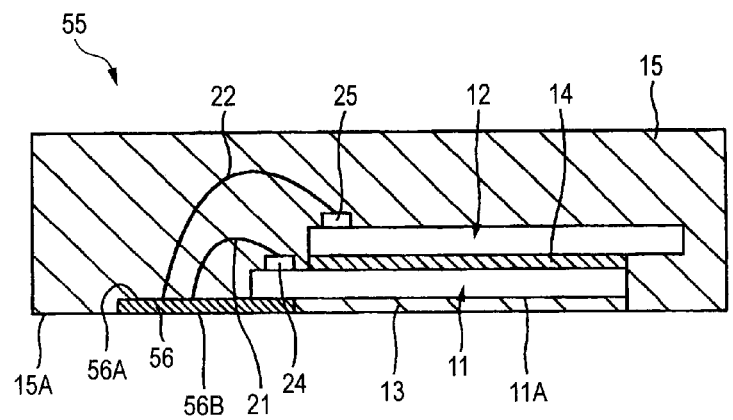
FIG. 24 is a sectional view of a semiconductor device according to a modified example of the second embodiment.

FIG. 24 is a sectional view of a semiconductor device according to a modified example of the second embodiment of the invention. In FIG. 24, like reference numerals will be given to like constituent portions to those of the semiconductor device 50 of the second embodiment.

Referring to FIG. 24, a semiconductor device 55 according to the modified example of the second embodiment is configured similarly to the semiconductor device 50 of the second embodiment except that external connecting terminals 56 are provided in place of the primary and secondary external connecting terminals 51, 52 which are provided on the semiconductor device 50.

The external connecting terminals 56 are sealed in by a secondary low-elasticity resin 15. The external connecting terminals 56 are disposed in such a manner as to be brought into partial contact with a lower surface 11A of a primary semiconductor chip 11. Upper surfaces 56A of the external connecting terminals 56 are electrically connected with the primary semiconductor chip 11 and a secondary semiconductor chip 12 via wires 21 and 22, respectively. Lower surfaces 56B of the external connecting terminals 56 are made to be substantially level with a lower surface 15A of the secondary low-elasticity resin 15.

When the semiconductor device 55 is mounted on a printed circuit board (not shown), wires (not shown) which are made to connect with a wiring pattern (not shown) on the printed circuit board are connected with portions of the external connecting terminals 56 which are in contact with the lower surface 11A of the primary semiconductor chip 11.

Also with the semiconductor device 55 according to the modified example of the second embodiment that is configured as described above, an advantage can be obtained which is the same as that obtained with the semiconductor device 50 of the second embodiment.

In addition, the semiconductor device 55 according to the modified example of the second embodiment can be fabricated by the same method as that by which the semiconductor device 50 of the second embodiment is fabricated, and an advantage can be obtained which is the same as that obtained with the fabricating method of the semiconductor device 10 of the first embodiment.

Third Embodiment

Figure 25:
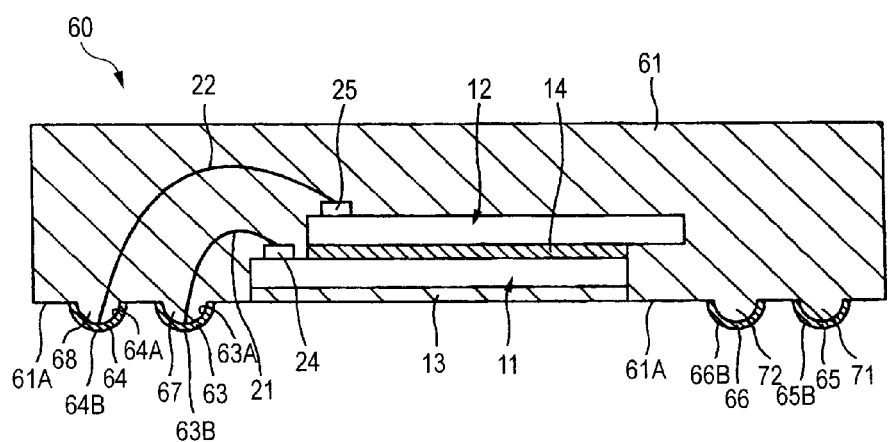
FIG. 25 is a sectional view of a semiconductor device according to a third embodiment of the invention.

FIG. 25 is a sectional view of a semiconductor device according to a third embodiment of the invention. In FIG. 25, like reference numerals will be given to like constituent portions to those of the semiconductor device 10 of the first embodiment.

Referring to FIG. 25, a semiconductor device 60 of the third embodiment is configured similarly to the semiconductor device 10 of the first embodiment except that a secondary low-elasticity resin 61 and primary and secondary external connecting terminals 63, 64 are provided in place of the secondary low-elasticity resin 15 and the primary and secondary external connecting terminals 16, 17 which are provided on the semiconductor device 10.

The secondary low-elasticity resin 61 is a resin of low elasticity modulus and has a function to mitigate stress. As the secondary low-elasticity resin 61, for example, a resin whose elasticity modulus is in the range of 1 MPa to 1 GPa can be used. In the event that a resin whose elasticity modulus is smaller than 1 MPa is used, the resin is so soft to produce difficulty in proper handling thereof at the time of fabricating the semiconductor device 60. On the contrary, in the event that a resin whose elasticity modulus is larger than 1 GPa is used, the effect of suppressing the generation of a warp in the semiconductor device 60 is reduced. To be specific, as the secondary low-elasticity resin 61, for example, an elastomer can be used.

Together with a primary low-elasticity resin 13, the secondary low-elasticity resin 61 seals primary and secondary semiconductor chips 11, 12 and wires 21, 22.

Since stress that is generated between the primary and secondary low-elasticity resins 13, 61 and the primary and secondary semiconductor chips 11, 12 (to be specific, semiconductor substrates (not shown) provided in the primary and secondary semiconductor chips 11, 12) which have different thermal expansion coefficients is mitigated by covering the stacked primary and secondary semiconductor chips 11, 12 by the primary and secondary low-elasticity resins 13, 61 in the way described above, the generation of a warp in the semiconductor 60 can be suppressed, thereby making it possible to secure sufficiently the reliability in connection between the primary external connecting terminals 63 and pads 24 and the reliability in connection between the secondary external connecting terminals 64 and secondary pads 25.

The secondary low-elasticity resin 61 has a plurality of protruding portions 67, 68, 71, 72 which protrude from a lower surface 61A thereof. The protruding portions 67, 68, 71, 72 can each be formed into, for example, a semi-spherical shape.

The primary external connecting terminals 63 are provided in such a manner as to cover the protruding portions 67, respectively. Internal surfaces of the primary external connecting terminals 63 are electrically connected with the pads 24 on the primary semiconductor chip 11 via the wires 21. External surfaces 63B of the primary external connecting terminals 63 are electrically connected with pads (not shown) on a printed circuit board (not shown) such as a motherboard when the semiconductor device 60 is mounted on the printed circuit board.

The secondary external connecting terminals 64 are provided in such a manner as to cover the protruding portions 68, respectively. Internal surfaces of the secondary external connecting terminals 64 are electrically connected with the pads 25 on the secondary semiconductor chip 12 via the wires 22. External surfaces 64B of the secondary external connecting terminals 64 are electrically connected with pads (not shown) on the printed circuit board (not shown) such as the motherboard when the semiconductor device 60 is mounted on the printed circuit board. As the primary and secondary external connecting terminals 63, 64, for example, a coating can be used in which Au/Ni/Au layers are stacked one on another in that order.

Dummy connecting terminals 65 are provided in such a manner as to cover the protruding portions 71, respectively. Dummy connecting terminals 66 are provided in such a manner as to cover the protruding portions 72, respectively. When the semiconductor device 60 is mounted on the printed circuit board (not shown) such as the motherboard, external surfaces 65B, 66B of the dummy connecting terminals 65, 66 are connected with dummy pads (not shown) which are provided on the printed circuit board (not shown). The dummy pads are pads which are not electrically connected with the wiring pattern provided on the printed circuit board (not shown).

The protruding portions 71, 72 and the dummy connecting terminals 65, 66 are such as to function to place the semiconductor device 60 substantially horizontal relative to the printed circuit board (not shown) when the semiconductor device 60 is mounted on the printed circuit board (not shown). As the dummy connecting terminals 65, 66, a coating can be used in which Au/Ni/Au layers are stacked one on another in that order.

Also with the semiconductor device 60 of the third embodiment that is configured in the way described above, an advantage can be obtained which is the same as that obtained with the semiconductor device 10 of the first embodiment.

Figure 26:
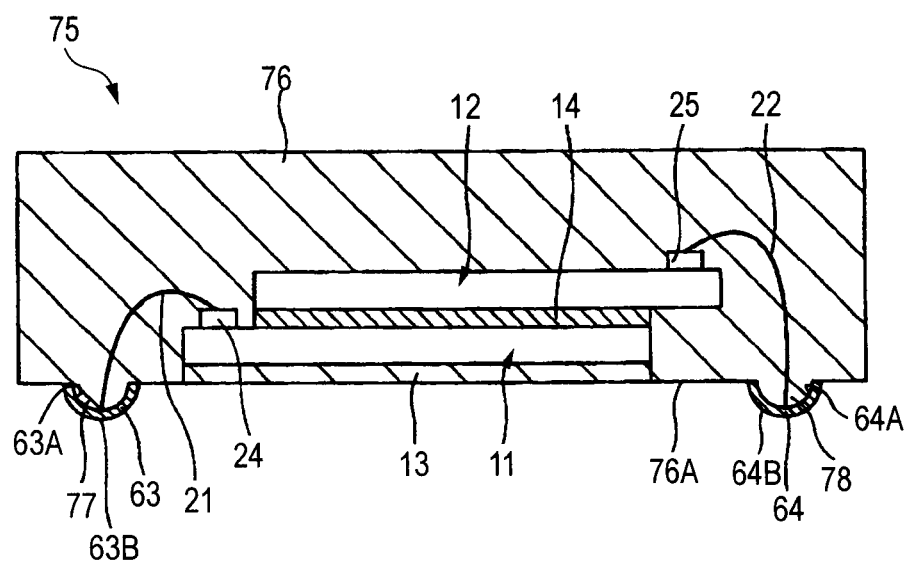
FIG. 26 is a sectional view of a semiconductor device according to a first modified example of the third embodiment of the invention.

FIG. 26 is a sectional view of a semiconductor device according to a first modified example of the third embodiment. In FIG. 26, like reference numerals will be given to like constituent portions to those of the semiconductor device 60 of the third embodiment.

Referring to FIG. 26, a semiconductor device 75 according to the first modified example of the third embodiment is configured similarly to the semiconductor device 60 of the third embodiment except that a secondary low-elasticity resin 76 is provided in place of the secondary low-elasticity resin 61 and the dummy connecting terminals 65, 66 and that the orientation of a secondary semiconductor chip 12 is rotated through 180 degrees from the state of the secondary semiconductor chip 12 shown in FIG. 25.

The secondary low-elasticity resin 76 is a resin of low elasticity modulus and has a function to mitigate stress. As the secondary low-elasticity resin 76, for example, a resin whose elasticity modulus is in the range of 1 MPa to 1 GPa can be used. In the event that a resin whose elasticity modulus is smaller than 1 MPa is used, the resin is so soft to produce difficulty in proper handling thereof at the time of fabricating the semiconductor device 75. On the contrary, in the event that a resin whose elasticity modulus is larger than 1 GPa is used, the effect of suppressing the generation of a warp in the semiconductor device 75 is reduced. To be specific, as the secondary low-elasticity resin 76, for example, an elastomer can be used.

Together with a primary low-elasticity resin 13, the secondary low-elasticity resin 76 seals a primary semiconductor chip 11 and the secondary semiconductor chip 12 and wires 21, 22. The secondary low-elasticity resin 76 has protruding portions 77, 78 which protrude from a lower surface 76A thereof. The protruding portions 78 are provided in such a manner as to face the protruding portions 77 across the primary semiconductor chip 11. Primary external connecting terminals 63 are provided in such a manner as to cover the protruding portions 77, respectively. Second external connecting terminals 64 are provided in such a manner as to cover the protruding portions 78, respectively.

Also with the semiconductor device 75 according to the first modified example of the third embodiment that is configured as has been described above, an advantage can be obtained which is the same as that obtained with the semiconductor device 10 of the first embodiment.

Figure 27:
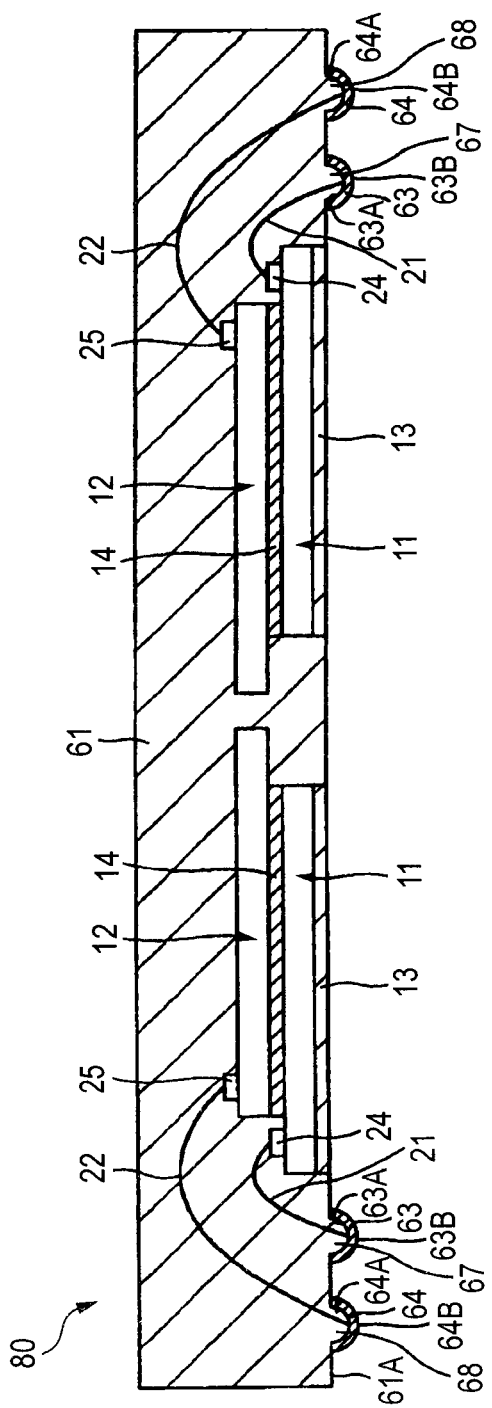
FIG. 27 is a sectional view of a semiconductor device according to a second modified example of the third embodiment of the invention.
Figure 28:
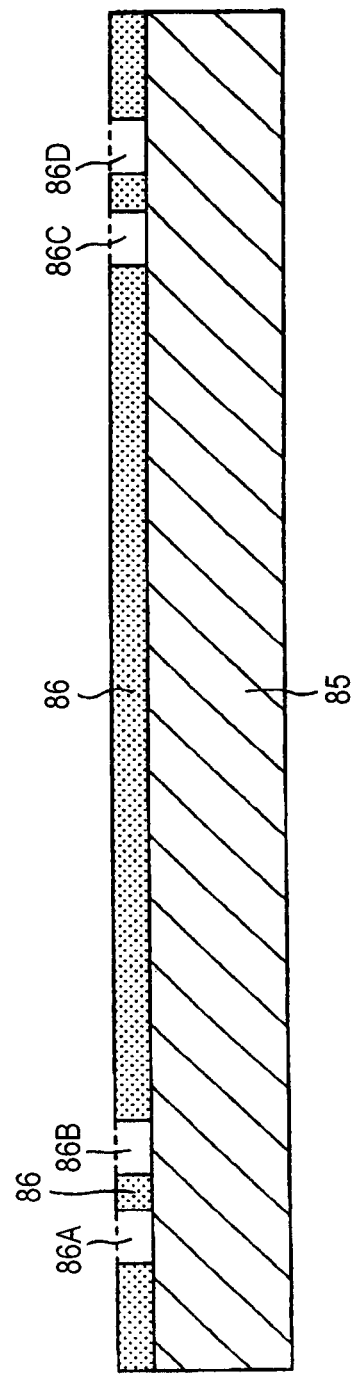
FIG. 28 is a (first) drawing showing a fabricating step of the semiconductor device according to the third embodiment of the invention.

FIG. 27 is a sectional view of a semiconductor device according to a second modified example of the third embodiment. In FIG. 27, like reference numerals will be given to like constituent portions of the semiconductor device 60 of the third embodiment.

Referring to FIG. 27, a semiconductor device 80 according to the second modified example of the third embodiment is configured similarly to the semiconductor device 60 of the third embodiment except that primary and secondary semiconductor chips 11, 12, wires 21, 22, primary and secondary external connecting terminals 63, 64 and protruding portions 67, 68 are provided further in place of the dummy connecting terminals 65, 66 and the protruding portions 71, 72 which are provided on the semiconductor device 60. The semiconductor device 80 is configured so as to have provided thereon two sets of stacked primary and secondary semiconductor chips 11, 12.

Also with the semiconductor device 80 according the second modified example of the third embodiment that is configured as described above, an advantage can be obtained which is similar to that obtained with the semiconductor device 10 of the first embodiment.

FIGS. 28 to 31 are drawings which show fabricating steps of the semiconductor device according to the third embodiment of the invention. In FIGS. 28 to 31, like reference numerals will be given to like constituent portions to those of the semiconductor device 60 of the third embodiment.

Referring to FIGS. 28 to 31, a fabricating method of the semiconductor device 60 of the third embodiment of the invention will be described. Firstly, in a step shown in FIG. 28, a photoresist coating 86 having openings 86A to 86D is formed on a metal plate 85 which constitutes a support plate. As a material of the metal plate 85, for example, Cu, 42 alloy and the like can be used. The openings 86A to 86D lie to correspond to positions where protruding portions 67, 68, 71, 72 are to be formed.

Figure 29:
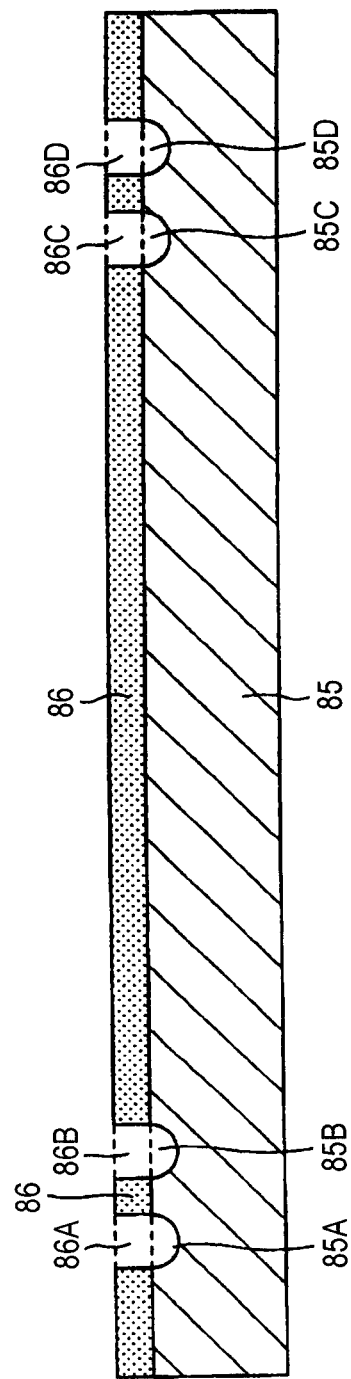
FIG. 29 is a (second) drawing showing a fabricating step of the semiconductor device according to the third embodiment of the invention.

Next, in a step shown in FIG. 29, the metal plate 85 is subjected to wet etching using the photoresist coating 86 as a mask, so as to form recessed portions 85A to 85D on the metal plate 85 which is exposed through the openings 86A to 86D.

Figure 30:
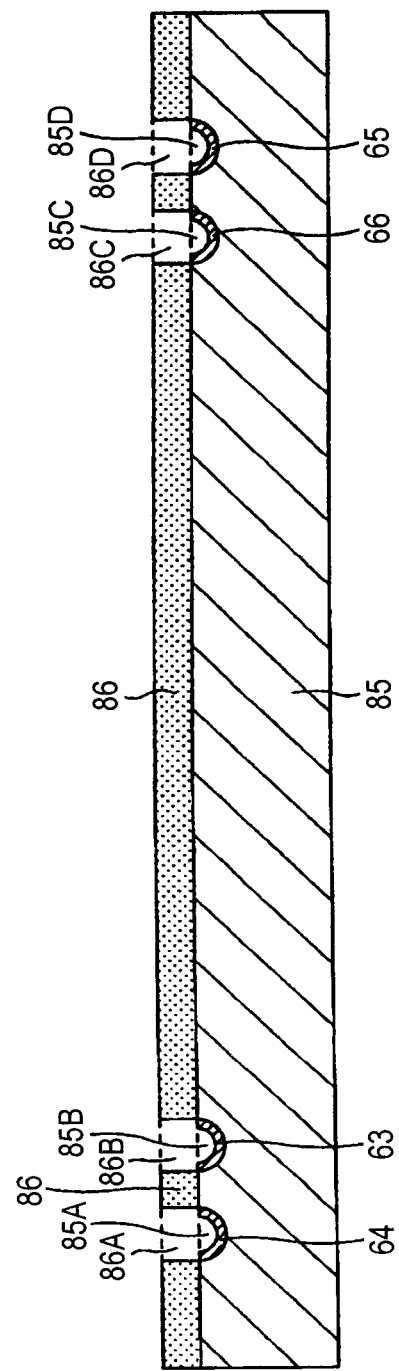
FIG. 30 is a (third) drawing showing a fabricating step of the semiconductor device according to the third embodiment of the invention.

Next, in a step shown in FIG. 30, conductive metal is precipitated on the metal plate 85 which is exposed in the recessed portions 85A to 85D by an electrolytic plating process in which the metal plate 85 is used as a feeding layer, so as to form primary and secondary external connecting terminals 63, 64 and dummy connecting terminals 65, 66 simultaneously (an external connecting terminal forming step).

Figure 31:
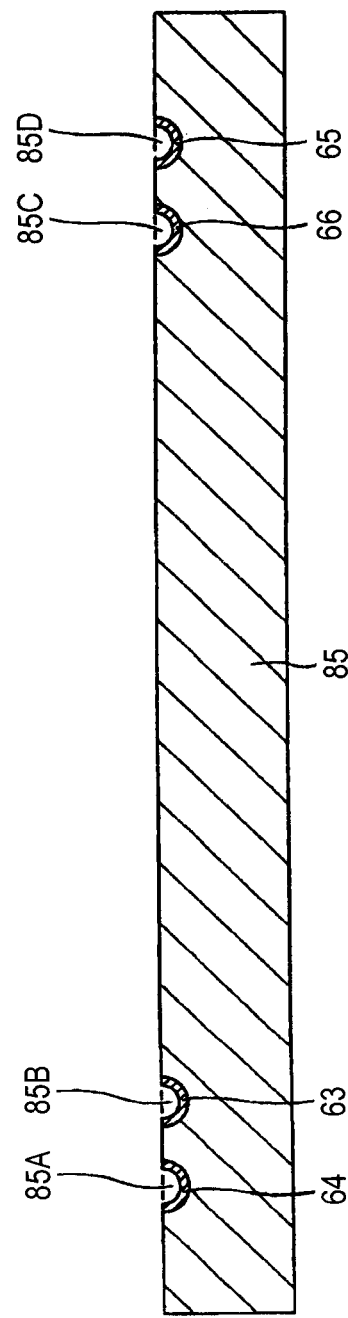
FIG. 31 is a (fourth) drawing showing a fabricating step of the semiconductor device according to the third embodiment of the invention.

Following this, in a step shown in FIG. 31, the photoresist coating 86 is removed. Thereafter, a similar process is carried out which is the same as the one carried out in the steps shown in FIGS. 17 to 21 which have been described above with respect to the first embodiment, whereby the semiconductor device 60 shown in FIG. 25 is fabricated.

Also with this semiconductor device fabricating method of this embodiment, an advantage can be obtained which is the same as that obtained with the semiconductor device 10 fabricating method of the first embodiment.

Fourth Embodiment

Figure 32:
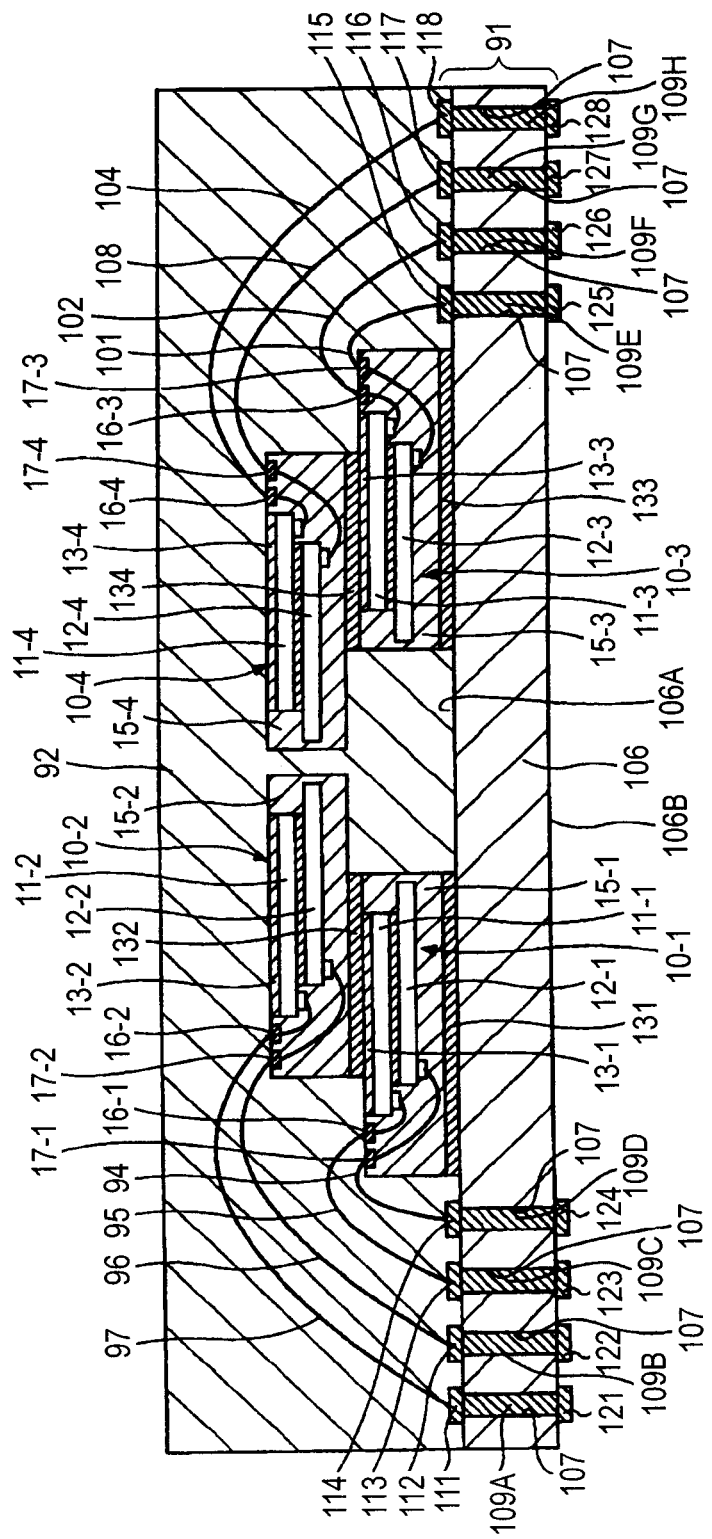
FIG. 32 is a sectional view of an electronic apparatus according to a fourth embodiment.

FIG. 32 is a sectional view of an electronic apparatus according to a fourth embodiment of the invention.

Referring to FIG. 32, an electronic apparatus 90 according the fourth embodiment has a printed circuit board 91, semiconductor devices 10-1 to 10-4, wires 94 to 97, 101 to 104, and a sealing resin 92 which is a second sealing resin.

The printed circuit board 91 has a substrate main body 106, through vias 109A to 109H, primary pads 111 to 118, and secondary pads 121 to 128. In this embodiment, a wiring pattern on the printed circuit board 91 is made up of the through vias 109A to 109H, the primary pads 111 to 118 and the secondary pads 121 to 128.

The substrate main body 106 is formed into a plate and has a plurality of through holes 107. The through vias 109A to 109H are provided in the through holes 107.

The primary pads 111 to 118 are provided on an upper surface 106A of the substrate main body 106. The primary pad 111 is connected with the through via 109A, and the primary pad 112 is connected with the through via 109B. The primary pad 113 is connected with the through via 109C, and the primary pad 114 is connected with the through via 109D. The primary pad 115 is connected with the through via 109E and the primary pad 116 is connected with the through via 109F. The primary pad 117 is connected with the through via 109G and the primary pad 118 is connected with the through via 109H.

The secondary pads 121 to 128 are provided on a lower surface 106B of the substrate main body 106. The secondary pad 121 is electrically connected with the primary pad 111 via the through via 109A. The secondary pad 122 is electrically connected with the primary pad 112 via the through via 109B. The secondary pad 123 is electrically connected with the primary pad 113 via the through via 109C. The secondary pad 124 is electrically connected with the primary pad 114 via the through via 109D. The secondary pad 125 is electrically connected with the primary pad 115 via the through via 109E. The secondary pad 126 is electrically connected with the primary pad 116 via the through via 109F. The secondary pad 127 is electrically connected with the primary pad 117 via the through via 109G. The secondary pad 128 is electrically connected with the primary pad 118 via the through via 109H. As the printed circuit board 91, for example, a motherboard can be used.

The semiconductor devices 10-1 to 10-4 are configured similarly to the semiconductor device 10 of the first embodiment. Note that in the following description, as a matter of convenience, "-1" is given to constituent elements of the semiconductor device 10-1, "-2" is given to constituent components of the semiconductor device 10-2, "-3" is given to constituent components of the semiconductor device 10-3, and "-4" is given to constituent components of the semiconductor device 10-4.

The semiconductor device 10-1 is affixed on to the substrate main body 106 via a chip fixing resin 131. As the chip fixing resin 131, for example, a die-attaching film can be used.

The semiconductor device 10-1 has a primary semiconductor chip 11-1, a secondary semiconductor chip 12-1, primary external connecting terminals 16-1 which are electrically connected with the primary semiconductor chip 11-1, secondary external connecting terminals 17-1 which are electrically connected with the secondary semiconductor chip 12-1, and primary and secondary low-elasticity resins 13-1, 15-1 which cover the primary and secondary semiconductor chips 11-1, 12-1. The primary external connecting terminals 16-1 are electrically connected with primary pads 113 via wires 95. The secondary external connecting terminals 17-1 are electrically connected with primary pads 114 via wires 94.

The semiconductor device 10-2 is affixed on to the primary semiconductor device 10-1 via a chip fixing resin 132. As the chip fixing resin 132, for example, a die-attaching film can be used. The semiconductor device 10-2 is stacked on the semiconductor device 10-1 in such a manner as not to overlap the primary and secondary external connecting terminals 16-1, 17-1.

The semiconductor device 10-2 has a primary semiconductor chip 11-2, a secondary semiconductor chip 12-2, primary external connecting terminals 16-2 which are electrically connected with the primary semiconductor chip 11-2, secondary external connecting terminals 17-2 which are electrically connected with the secondary semiconductor chip 12-2, and primary and secondary low-elasticity resins 13-2, 15-2 which cover the primary and secondary semiconductor chips 11-2, 12-2. The primary external connecting terminals 16-2 are electrically connected with primary pads 111 via wires 97. The secondary external connecting terminals 17-2 are electrically connected with primary pads 112 via wires 96.

The semiconductor device 10-3 is affixed on to the substrate main body 106 via a chip fixing resin 133. As the chip fixing resin 133, for example, a die-attaching film can be used. The semiconductor device 10-3 has a primary semiconductor chip 11-3, a secondary semiconductor chip 12-3, primary external connecting terminals 16-3 which are electrically connected with the primary semiconductor chip 11-3, secondary external connecting terminals 17-3 which are electrically connected with the secondary semiconductor chip 12-3, and primary and secondary low-elasticity resins 13-3, 15-3 which cover the primary and secondary semiconductor chips 11-3, 12-3. The primary external connecting terminals 16-3 are electrically connected with primary pads 116 via wires 102. The secondary external connecting terminals 17-3 are electrically connected with primary pads 115 via wires 101.

The semiconductor device 10-4 is affixed on to the primary semiconductor device 10-3 via a chip fixing resin 134. As the chip fixing resin 134, for example, a die-attaching film can be used. The semiconductor device 10-4 is stacked on the semiconductor device 10-3 in such a manner as not to overlap the primary and secondary external connecting terminals 16-3, 17-3. The semiconductor device 10-4 has a primary semiconductor chip 11-4, a secondary semiconductor chip 12-4, primary external connecting terminals 16-4 which are electrically connected with the primary semiconductor chip 11-4, secondary external connecting terminals 17-4 which are electrically connected with the secondary semiconductor chip 12-4, and primary and secondary low-elasticity resins 13-4, 15-4 which cover the primary and secondary semiconductor chips 11-4, 12-4. The primary external connecting terminals 16-4 are electrically connected with primary pads 118 via wires 104. The secondary external connecting terminals 17-4 are electrically connected with primary pads 117 via wires 103.

The sealing resin 92 is provided on the printed circuit board 91 in such a manner as to seal the semiconductor devices 10-1 to 10-4 and the wires 94 to 97, 101 to 104. As the sealing resin 92, for example, a resin can be used whose elasticity modulus is 10 GPa or more. To be specific, for example, a molding resin can be using as the sealing resin 92.

According to the electronic apparatus of this embodiment, since stress that is generated between the printed circuit board 91 and the primary and secondary semiconductor chips 11-1 to 11-4, 12-1 to 12-4 is mitigated by providing the semiconductor devices 10-1 to 10-4 in which the primary and secondary semiconductor chips 11-1 to 11-4, 12-1 to 12-4 are covered by the primary and secondary low-elasticity resins 13-1 to 13-4, 15-1 to 15-4 which each have a function to mitigate stress, the primary and secondary semiconductor chips 11-1 to 11-4, 12-1 to 12-4 can be made difficult to be affected by a warp in the electronic apparatus 90.

Note that while in this embodiment, the die-attaching film is described as being used for the chip fixing resins 131 to 134, the primary low-elasticity resin 13 may be used in place of the chip fixing resins 131 to 134. In addition, while in this embodiment, the molding resin is described as being used as the sealing resin 92, the secondary low-elasticity resin 15 may be used in place of the molding resin. In this way, by using the low-elasticity resins as the chip fixing resins 131 to 134 and the sealing resin 92, the generation of a warp in the electronic apparatus 90 can further be suppressed.

Fifth Embodiment

FIG. 33 is a sectional view of an electronic apparatus according to a fifth embodiment of the invention. In FIG. 33, like reference numerals will be given to like constituent portions to those of the electronic apparatus 90 of the fourth embodiment.

Referring to FIG. 33, an electronic apparatus 140 of the fifth embodiment is configured similarly to the electronic apparatus 90 of the fourth embodiment except that semiconductor devices 50-1 to 50-4 are provided in place of the semiconductor devices 10-1 to 10-4 which are provided on the electronic apparatus 90.

The semiconductor devices 50-1 to 50-4 are configured similarly to the semiconductor device 50 of the second embodiment. Note that in the following description, as a matter of convenience, "-1" is given to constituent elements of the semiconductor device 50-1, "-2" is given to constituent components of the semiconductor device 50-2, "-3" is given to constituent components of the semiconductor device 50-3, and "-4" is given to constituent components of the semiconductor device 50-4.

The semiconductor device 50-1 is affixed on to a substrate main body 106 via a chip fixing resin 131. The semiconductor device 50-1 has a primary semiconductor chip 11-1, a secondary semiconductor chip 12-1, primary external connecting terminals 51-1 which are electrically connected with the primary semiconductor chip 11-1, secondary external connecting terminals 52-1 which are electrically connected with the secondary semiconductor chip 12-1, and primary and secondary low-elasticity resins 13-1, 15-1 which cover the primary and secondary semiconductor chips 11-1, 12-1. The primary and secondary external connecting terminals 51-1, 52-1 are disposed in such a manner as to be brought into partial contact with a lower surface 11-1A of the primary semiconductor chip 11-1. The primary external connecting terminals 51-1 are electrically connected with primary pads 113 via wires 95. The wires 95 are connected with the primary external connecting terminals 51-1 which are situated on the lower surface 11-1A of the semiconductor chip 11-1.

Since the primary semiconductor chip 11-1 constitutes a support plate which restricts the positions of the primary external connecting terminals 51-1 by making the wires 95 connect with the primary external connecting terminals 51-1 which are situated on the lower surface 11-1A of the semiconductor chip 11-1 in this way, the connection between the wires 95 and the primary external connecting terminals 51-1 can be made strong and rigid.

The secondary external connecting terminals 52-1 are electrically connected with primary pads 114 via wires 94. The wires 94 are connected with the secondary external connecting terminals 52-1 which are situated on the lower surface 11-1A of the semiconductor chip 11-1.

Since the primary semiconductor chip 11-1 constitutes a support plate which restricts the positions of the secondary external connecting terminals 52-1 by making the wires 94 connect with the secondary external connecting terminals 52-1 which are situated on the lower surface 11-1A of the semiconductor chip 11-1 in this way, the connection between the wires 94 and the secondary external connecting terminals 52-1 can be made strong and rigid.

The semiconductor device 50-2 is affixed on to the semiconductor device 50-1 via a chip fixing resin 132. The semiconductor device 50-2 is stacked on the semiconductor device 50-1 in such a manner as not to overlap the primary and secondary external connecting terminals 51-1, 52-1. The semiconductor device 50-2 has a primary semiconductor chip 11-2, a secondary semiconductor chip 12-2, primary external connecting terminals 51-2 which are electrically connected with the primary semiconductor chip 11-2, secondary external connecting terminals 52-2 which are electrically connected with the secondary semiconductor chip 12-2 and primary and secondary low-elasticity resins 13-2, 15-2 which cover the primary and secondary semiconductor chips 11-2, 12-2. The primary and secondary external connecting terminals 51-2, 52-2 are disposed in such a manner that the primary and secondary external connecting terminals contact at least partially a lower surface 11-2A of the primary semiconductor chip 11-2. The primary external connecting terminals 51-2 are electrically connected with primary pads 111 via wires 97. The wires 97 are connected with the primary external connecting terminals 51-2 which are situated on the lower surface 11-2A of the semiconductor chip 11-2.

Since the primary semiconductor chip 11-2 constitutes a support plate which restricts the positions of the primary external connecting terminals 51-2 by making the wires 97 connect with the primary external connecting terminals 51-2 which are situated on the lower surface 11-2A of the semiconductor chip 11-2 in this way, the connection between the wires 97 and the primary external connecting terminals 51-2 can be made strong and rigid.

The secondary external connecting terminals 52-2 are electrically connected with primary pads 112 via wires 96. The wires 96 are connected with the secondary external connecting terminals 52-2 which are situated on the lower surface 11-2A of the semiconductor chip 11-2.

Since the primary semiconductor chip 11-2 constitutes a support plate which restricts the positions of the secondary external connecting terminals 52-2 by making the wires 96 connect with the secondary external connecting terminals 52-2 which are situated on the lower surface 11-2A of the semiconductor chip 11-2 in this way, the connection between the wires 96 and the secondary external connecting terminals 52-2 can be made strong and rigid.

The semiconductor device 50-3 is affixed on to the substrate main body 106 via a chip fixing resin 133. The semiconductor device 50-3 has a primary semiconductor chip 11-3, a secondary semiconductor chip 12-3, primary external connecting terminals 51-3 which are electrically connected with the primary semiconductor chip 11-3, secondary external connecting terminals 52-3 which are electrically connected with the secondary semiconductor chip 12-3, and primary and secondary low-elasticity resins 13-3, 15-3 which cover the primary and secondary semiconductor chips 11-3, 12-3. The primary and secondary external connecting terminals 51-3, 52-3 are disposed in such a manner as to be brought into partial contact with a lower surface 11-3A of the primary semiconductor chip 11-3.

The primary external connecting terminals 51-3 are electrically connected with primary pads 116 via wires 102. The wires 102 are connected with the primary external connecting terminals 51-3 which are situated on the lower surface 11-3A of the semiconductor chip 11-3.

Since the primary semiconductor chip 11-3 constitutes a support plate which restricts the positions of the primary external connecting terminals 51-3 by making the wires 102 connect with the primary external connecting terminals 51-3 which are situated on the lower surface 11-3A of the semiconductor chip 11-3 in this way, the connection between the wires 102 and the primary external connecting terminals 51-3 can be made strong and rigid.

The secondary external connecting terminals 51-3 are electrically connected with primary pads 115 via wires 101. The wires 101 are connected with the secondary external connecting terminals 52-3 which are situated on the lower surface 11-3A of the semiconductor chip 11-3.

Since the primary semiconductor chip 11-3 constitutes a support plate which restricts the positions of the secondary external connecting terminals 52-3 by making the wires 101 connect with the secondary external connecting terminals 52-3 which are situated on the lower surface 11-3A of the semiconductor chip 11-3 in this way, the connection between the wires 101 and the secondary external connecting terminals 52-3 can be made strong and rigid.

The semiconductor device 50-4 is affixed on to the semiconductor device 50-3 via a chip fixing resin 134. The semiconductor device 50-4 is stacked on the semiconductor device 50-3 in such a manner as not to overlap the primary and secondary external connecting terminals 51-3, 52-3. The semiconductor device 50-4 has a primary semiconductor chip 11-4, a secondary semiconductor chip 12-4, primary external connecting terminals 51-4 which are electrically connected with the primary semiconductor chip 11-4, secondary external connecting terminals 52-4 which are electrically connected with the secondary semiconductor chip 12-4 and primary and secondary low-elasticity resins 13-4, 15-4 which cover the primary and secondary semiconductor chips 11-4, 12-4.

The primary and secondary external connecting terminals 51-4, 52-4 are disposed in such a manner that the primary and secondary external connecting terminals contact at least partially a lower surface 11-4A of the primary semiconductor chip 11-4. The primary external connecting terminals 51-4 are electrically connected with primary pads 118 via wires 104. The wires 104 are connected with the primary external connecting terminals 51-4 which are situated on the lower surface 11-4A of the semiconductor chip 11-4.

Since the primary semiconductor chip 11-4 constitutes a support plate which restricts the positions of the primary external connecting terminals 51-4 by making the wires 104 connect with the primary external connecting terminals 51-4 which are situated on the lower surface 11-4A of the semiconductor chip 11-4 in this way, the connection between the wires 104 and the primary external connecting terminals 51-4 can be made strong and rigid.

The secondary external connecting terminals 52-4 are electrically connected with primary pads 117 via wires 103. The wires 103 are connected with the secondary external connecting terminals 52-4 which are situated on the lower surface 11-4A of the semiconductor chip 11-4.

Since the primary semiconductor chip 11-4 constitutes a support plate which restricts the positions of the secondary external connecting terminals 52-4 by making the wires 103 connect with the secondary external connecting terminals 52-4 which are situated on the lower surface 11-4A of the semiconductor chip 11-4 in this way, the connection between the wires 103 and the secondary external connecting terminals 52-4 can be made strong and rigid.

A sealing resin 92 is provided on a printed circuit board 91 in such a manner as to seal the semiconductor devices 50-1 to 50-4 and the wires 94 to 97, 101 to 104.

According to the electronic apparatus of this embodiment, the connection between the wires 94 to 94, 101 to 104 and the primary and secondary external connecting terminals 51-1 to 51-4, 52-1 to 52-4 can be made strong and rigid by making the wires 94 to 97, 101 to 104 connect with portions of the primary and secondary external connecting terminals 51-1 to 51-4, 52-1 to 52-4 which are brought into contact with the lower surfaces 11-1A to 11-4A of the primary semiconductor chips 11-1 to 11-4, respectively.

In addition, with the electronic apparatus of this embodiment, an advantage can be obtained which is the same as that obtained with the electronic apparatus 90 of the fourth embodiment.

Note that in this embodiment, the primary low-elasticity resin 13 may be used as the chip fixing resins 131 to 134. In addition, the secondary low-elasticity resin 15 may be used as the sealing resin 92.

Thus, while the invention has been described based on the preferred embodiments thereof, the invention is not limited to those specific embodiments but can be modified or changed variously without departing from the spirit and scope of the invention which are described under the claims of the invention.

The invention can be applied to a semiconductor device which includes a semiconductor chip and a sealing resin which seals the semiconductor chip and an electronic apparatus which includes the semiconductor device.

What is claimed is:

1. A semiconductor device comprising:
   a semiconductor chip assembly having a primary semiconductor chip and a secondary semiconductor chip stacked on the primary semiconductor chip, said secondary semiconductor chip being stacked on an upper surface side of the primary semiconductor chip such that a first portion of the secondary semiconductor chip overlays a portion of the upper surface side of the primary semiconductor chip and a second portion of the secondary semiconductor chip extends beyond the upper surface side of the primary semiconductor chip; and a sealing resin having a low modulus of elasticity which seals and fully encapsulates the semiconductor chip assembly, wherein the sealing resin comprises: a primary sealing resin having a low modulus of elasticity that seals a lower surface side of the primary semiconductor chip that is opposed to the upper surface side of the primary semiconductor chip on which the secondary semiconductor chip is stacked; and a secondary sealing resin having a low modulus of elasticity that seals all other surface sides of the semiconductor chip assembly, wherein the semiconductor chip assembly further includes a pad on the upper surface side of the primary semiconductor chip that is electrically connected to an upper surface of a primary external connecting terminal by a wire, and a pad on an upper surface side of the secondary semiconductor chip that is electrically connected to an upper surface of a secondary external connecting terminal by a wire, wherein lower surfaces of the primary and secondary external connecting terminals, which are respectively opposite to the upper surfaces of the primary and secondary external connecting terminals, are exposed from the sealing resin and are flush with a surface of the secondary sealing resin and level with a lower surface of the primary sealing resin, wherein a height of the primary external connecting terminal equals a height of the secondary external connecting terminal, said height of the primary external connecting terminal measured between the lower surface and upper surface of the primary external connecting terminal, and said height of the secondary external connecting terminal measured between the lower surface and upper surface of the secondary external connecting terminal.

2. The semiconductor device as set forth in claim 1, wherein the modulus of elasticity of the primary sealing resin is greater than or equal to 1 MPa and less than or equal to 1 GPa and the modulus of elasticity of the secondary sealing resin is greater than or equal to 1 MPa and less than or equal to 1 GPa.

3. The semiconductor device as set forth in claim 1, wherein at least one of the primary and secondary external connecting terminals projects into the sealing resin.

\* \* \* \* \*